United States Patent
Shinbo et al.

(10) Patent No.: US 7,020,444 B2
(45) Date of Patent: Mar. 28, 2006

(54) HIGH FREQUENCY SEMICONDUCTOR INTEGRATED CIRCUIT AND RADIO COMMUNICATION SYSTEM

(75) Inventors: Jiro Shinbo, Takasaki (JP); Hirotaka Oosawa, Isesaki (JP); Noriyuki Kurakami, Maebashi (JP); Masumi Kasahara, Takasaki (JP); Robert Astle Henshaw, Sudbury (GB)

(73) Assignee: Renesas Technology Corp., Tokyo (JP)

( * ) Notice: Subject to any disclaimer, the term of this patent is extended or adjusted under 35 U.S.C. 154(b) by 414 days.

(21) Appl. No.: 10/372,922

(22) Filed: Feb. 26, 2003

(65) Prior Publication Data

US 2004/0053595 A1  Mar. 18, 2004

(30) Foreign Application Priority Data

Sep. 13, 2002  (GB)  .................................. 0221303

(51) Int. Cl.
  *H04B 1/40*  (2006.01)
(52) U.S. Cl. ...................................... 455/76; 455/552.1
(58) Field of Classification Search ................. 455/73, 455/76, 552.1, 103, 188.1, 190.1, 180.1, 455/333, 260, 265; 331/46, 47, 48, 1 A
See application file for complete search history.

(56) References Cited

U.S. PATENT DOCUMENTS

| 4,321,706 A | 3/1982 | Craft |
| 4,458,214 A | 7/1984 | Lakomy |
| 5,852,784 A * | 12/1998 | Ito et al. .................. 455/552.1 |
| 6,766,178 B1 * | 7/2004 | Damgaard et al. ........ 455/552.1 |
| 6,900,700 B1 * | 5/2005 | Oosawa et al. ................ 331/46 |

FOREIGN PATENT DOCUMENTS

| GB | 2357381 | 6/2001 |

\* cited by examiner

*Primary Examiner*—Nguyen T. Vo
(74) *Attorney, Agent, or Firm*—Mattingly, Stanger, Malur & Brundidge, P.C.

(57) ABSTRACT

A communication semiconductor integrated circuit has an oscillator circuit forming part of a transmission PLL circuit fabricated on a single semiconductor chip together with an oscillator circuit forming part of a reception PLL circuit and an oscillator circuit for an intermediate frequency. The oscillator circuit for the transmission PLL circuit is configured to be operable in a plurality of bands. The communication semiconductor integrated circuit also comprises a circuit for measuring the oscillating frequency of the oscillator circuit for the transmission PLL circuit, and a storage circuit for storing the result of measurement made by the measuring circuit. A band to be used by the oscillator circuit for the transmission PLL circuit is determined based on values for setting the oscillating frequencies of the oscillator circuit forming part of the reception PLL circuit and the intermediate frequency oscillator circuit, and the result of measurement stored in the storage circuit.

10 Claims, 12 Drawing Sheets

HIGH FREQUENCY SEMICONDUCTOR INTEGRATED CIRCUIT AND RADIO COMMUNICATION SYSTEM

CROSS-REFERENCE TO RELATED APPLICATION

The present application relates to subject matters described in the U.S. patent applications being file based on the United Kingdom Patent Applications No. 0221310.1 filed on Sep. 13, 2002. That U.S. application is assigned to the same assignees of the present application.

BACKGROUND OF THE INVENTION

The present invention relates generally to techniques which are effectively applied to an on-chip voltage controlled oscillator circuit (VCO) that can switch oscillating frequencies, and more particularly, to techniques which are effectively utilized in high frequency semiconductor integrated circuits and radio communication systems for demodulating a reception signal and modulating a transmission signal in radio communication apparatuses, for example, a portable telephone and the like which can transmit and receive signals in a plurality of bands.

A radio communication system such as a portable telephone uses a PLL (phase locked loop) circuit which has a VCO for generating an oscillating signal at a predetermined frequency. The oscillating signal is combined with a reception signal and a transmission signal. Conventional portable telephones include a dual-band portable telephone which can handle signals in two frequency bands, for example, a GSM (Global System for Mobile Communication) signal in a band of 880–915 MHz and a DCS (Digital Cellular System) signal in a band of 1710–1785 MHz. Some dual-band portable telephones are designed to support two different bands with a single PLL circuit by switching the frequency of the PLL circuit.

In recent years, however, a need exists for a triple-band portable telephone which can handle, for example, a PCS (Personal Communication System) signal in a band of 1850–1915 MHz in addition to the GSM and DCS signals. It is also contemplated that the portable telephones are required to support a larger number of bands in the future.

For a high frequency semiconductor integrated circuit (hereinafter called the "high frequency IC") designed to modulate a transmission signal and demodulate a reception signal, for use in such a portable telephone which can support a plurality of bands, a direct conversion system is effective from a viewpoint of a reduction in the number of parts. While the direct conversion system is relatively easy in supporting a plurality of bands, a VCO should be capable of oscillating over a wide frequency range. In this event, when a single VCO is used with the intention to cover the overall frequency range, the resulting VCO would be extremely sensitive to a control voltage applied thereto, and therefore vulnerable to extraneous noise and fluctuations in a power supply voltage.

On the other hand, a reduction in the number of parts may be effectively accomplished by forming a VCO, which has been typically fabricated in a module separate from a high frequency IC in many cases, on the same semiconductor chip on which the high frequency IC is fabricated. However, since an on-chip VCO manufactured by the current technologies experiences large variations in the absolute value of the oscillating frequency, the on-chip VCO must be provided with a function of correcting the oscillating frequency after the manufacturing. However, if the variations are corrected by trimming based on a mask option or a bonding wire option, typically used in conventional semiconductor integrated circuits, the cost is inevitably increased.

To solve these problems, the inventors have previously developed a communication semiconductor integrated circuit (high frequency IC) comprising a PLL circuit, and filed a PCT application No. PCT/GB2002/005152 on Nov. 13, 2002 based on U.K. Patent Application No. 0127537.9. The PCT application is pending but not admitted as the prior art. In this communication semiconductor integrated circuit, an oscillator circuit (RFVCO) for generating a high frequency signal for use in transmission and reception is desired to operate in a plurality of bands. The oscillating frequency of the oscillator circuit is measured in each of the bands while the oscillator circuit is applied with a control voltage fixed at a predetermined value, and stored in a storage circuit. A set value for specifying the frequency, applied during a PLL operation, is compared with the measured frequency values stored in the storage circuit to determine a band which is actually used in the oscillator circuit from the result of the comparison. The resulting communication semiconductor integrated circuit does not have a higher sensitivity to the control voltage, and therefore is less susceptible to extraneous noise and fluctuations in the power supply voltage even with a wider frequency range available for the VCO to oscillate for supporting a plurality of communication schemes. In addition, the communication semiconductor integrated circuit can automatically correct variations in the oscillating frequency of the VCO in an internal circuit.

SUMMARY OF THE INVENTION

A high frequency IC for use in a portable telephone typically has a transmission related circuit and a reception related circuit which are integrated on a single semiconductor chip. The prior application also discloses a high frequency IC which has a transmission related circuit integrated on a single semiconductor chip together with a reception related circuit. However, the high frequency IC disclosed in the prior application has a transmission VCO as an externally mounted circuit though an RFVCO is integrated on the chip. The RFVCO precedes the transmission VCO in the integration on the chip for the reasons set forth below.

First, in a high frequency IC which can support two communication schemes, GSM and DCS, intended by the inventors for development, the RFVCO oscillates in a higher frequency band than the transmission VCO, so that larger advantages are provided by fabricating the on-chip RFVCO in view of the power consumption. Second, an on-chip VCO involves a circuit for correcting inherent variations in frequency, whereas a PLL circuit for generating a frequency signal which is mixed with a reception signal for downconverting the reception signal is often provided with a frequency division counter for dividing an oscillating signal of the VCO to measure the frequency for locking a PLL loop at a desired frequency found from a comparison with a reference signal. This frequency division counter may be used to create a circuit for measuring the frequency to correct variations in frequency. However, due to lack of such a frequency division counter, a transmission PLL circuit must be additionally provided with a circuit for measuring the frequency to correct variations in frequency. As such, a significant increase in the circuit scale is anticipated from the addition of the circuit for measuring the frequency.

On the other hand, since the transmission VCO is required to oscillate in a wider frequency band than the RFVCO, two transmission VCOs are needed, one for GSM and one for DCS. Therefore, from a viewpoint of a reduction in the number of parts, an on-chip transmission VCO is more effective than an on-chip RFVCO. Bearing this in mind, the inventors considered to mount a transmission VCO on a high frequency IC suitable for a multi-band portable telephone in order to further reduce the number of parts. The present invention was made in course of this consideration.

Technical challenges involved in mounting a transmission VCO on a high frequency IC for a multi-band portable telephone includes:

(1) the transmission VCO should be able to oscillate over a wide frequency range;

(2) the transmission VCO should be able to correct the oscillating frequency for variations;

(3) the area of a chip mounted with the transmission VCO should be reduced as much as possible;

(4) a band used by the transmission VCO can be determined in a short time; and so forth.

The aforementioned prior application discloses a circuit for correcting the frequency for variations associated with the fabrication of the on-chip RFVCO. While this technique may be applied to the transmission VCO to reduce the variations in frequency, a similar circuit for correcting the frequency for variations, if provided for the transmission VCO, would result in a prohibitively large circuit scale. Particularly, in a system considered by the inventors, the reception PLL circuit comprises a counter for frequency division, but the transmission PLL circuit does not comprise a counter for frequency division, so that the circuit scale would be further increased if the transmission PLL circuit is provided with a circuit for counting the frequency for correction, as disclosed in the prior application.

Also, the prior application described above, since the transmission VCO is externally mounted to the high frequency IC, a band used by the transmission VCO is directly selected by the baseband circuit. However, when the transmission VCO is built in the high frequency IC, an internal control circuit must be responsible for the selection of the band to be used by the transmission VCO. In this event, an instruction may be sent from the baseband circuit to the high frequency IC for selecting a band, in which case a significantly long time could be taken from the time the baseband circuit generates the instruction to the time a band to be used by the transmission VCO is actually determined due to a time required for the transmission of the instruction signal, a time required for the control circuit to decode the instruction, and the like. Particularly, when an instruction to the high frequency IC is made up of serial data, the transmission of the instruction takes a relatively long time.

It is an object of the present invention to provide a communication semiconductor integrated circuit (high frequency IC) which is capable of selecting a band to be used by a transmission oscillator circuit (VCO) in a short time when the transmission oscillator circuit, forming part of a transmission PLL circuit, is fabricated on a single semiconductor chip together with other oscillator circuits such as an intermediate frequency oscillator circuit.

It is another object of the present invention to provide a communication semiconductor integrated circuit which is capable of reducing the burden on a baseband circuit for determining a band to be used by a transmission oscillator circuit, when the transmission oscillator circuit, forming part of a transmission PLL circuit, is fabricated on a single semiconductor chip together with other oscillator circuits such as an intermediate frequency oscillator circuit.

It is a further object of the present invention to provide a communication semiconductor integrated circuit which is capable of communicating signals in a plurality of frequency bands, and comprises a plurality of oscillator circuits which can be formed on the same semiconductor chip to thereby reduce the number of parts.

The above and other objects, and novel features of the invention will become apparent from the following description of the specification and the accompanying drawings.

According to one aspect of the present invention, a communication semiconductor integrated circuit has an oscillator circuit, which forms part of a transmission PLL circuit, fabricated on a single semiconductor chip together with an oscillator circuit forming part of a reception PLL circuit and an oscillator circuit for an intermediate frequency. The oscillator circuit forming part of the transmission PLL circuit is configured to be operable in a plurality of bands. The communication semiconductor integrated circuit includes a circuit for measuring the oscillating frequency of the oscillator circuit which forms part of the transmission PLL circuit, and means for storing the result of the measurement made by the measuring circuit. A band to be used by the oscillator circuit forming part of the transmission PLL circuit is determined based on values for setting the oscillating frequencies of the oscillator circuit forming part of the reception PLL circuit and the intermediate frequency oscillator circuit, and the stored result of the measurement.

According to the communication semiconductor integrated circuit in the foregoing aspect, since the communication semiconductor integrated circuit internally determines a band to be used by the oscillator circuit forming part of the transmission PLL circuit, no instruction is required from an external baseband circuit or the like, thereby eliminating the time required to send the instruction. Consequently, a band to be used by the oscillator circuit can be selected in a short time. Also, the baseband circuit is not required to determine a band to be used by the oscillator circuit forming part of the transmission PLL circuit, and no instruction need be sent from the external baseband circuit because the communication semiconductor integrated circuit internally determines a band to be used by the transmission oscillator circuit, so that the communication semiconductor integrated circuit can reduce the burden on the baseband circuit for selecting the band to be used by the transmission oscillator circuit.

DESCRIPTION OF THE EMBODIMENTS

In the following, one embodiment of the present invention will be described with reference to the accompanying drawings.

Figure 1:
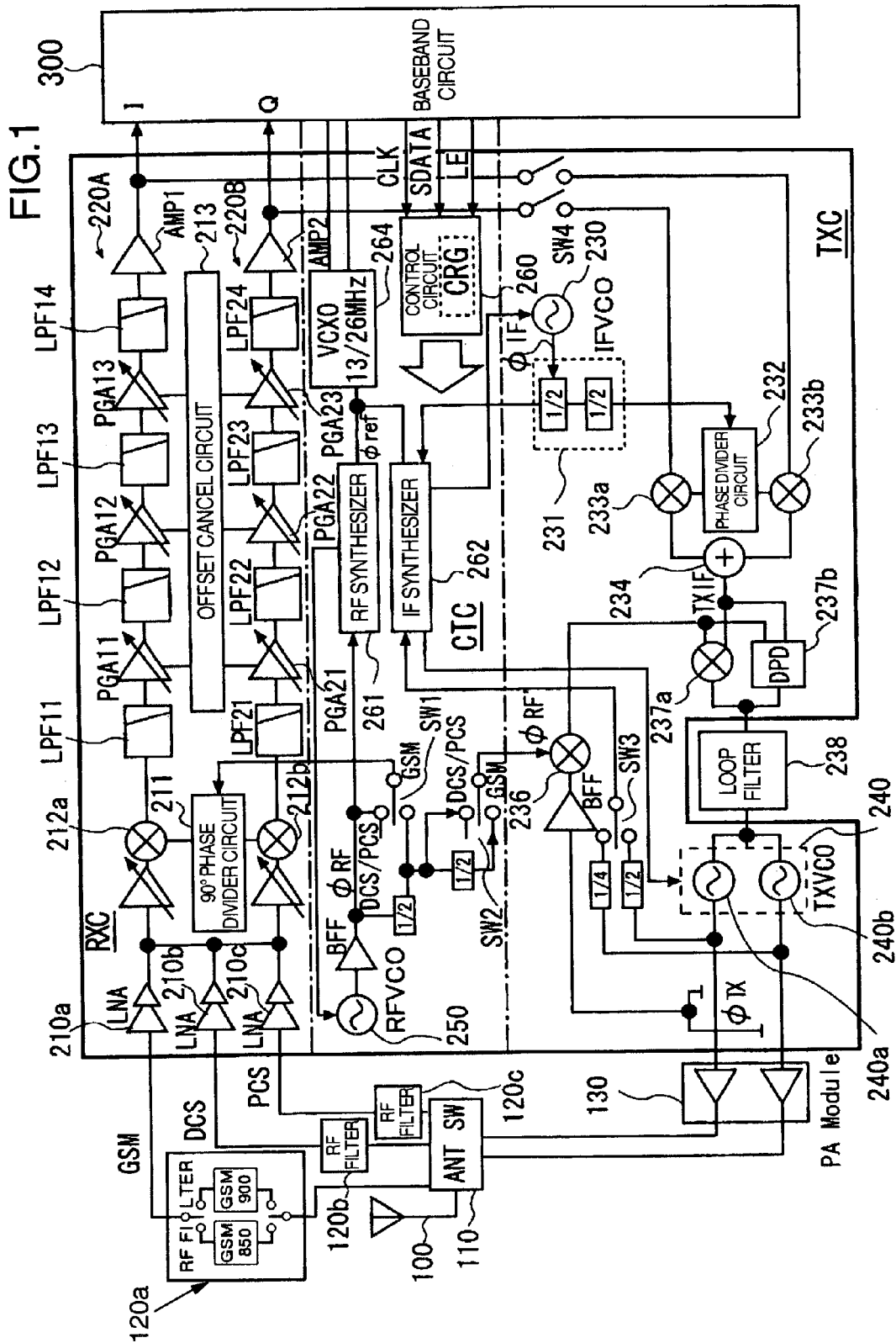
FIG. 1 is a block diagram illustrating an exemplary configuration of a multi-band communication semiconductor integrated circuit (high frequency IC) according to one embodiment of the present invention, and a radio communication system using the communication semiconductor integrated circuit.

FIG. 1 is a block diagram illustrating an exemplary configuration of a multi-band communication semiconductor integrated circuit (high frequency IC) according to one embodiment of the present invention, and a radio communication system using the communication semiconductor integrated circuit.

The radio communication system illustrated in FIG. 1 comprises an antenna 100 for transmitting and receiving signal radio waves; a switch 110 for switching transmission and reception; high frequency filters 120a–120c such as SAW filters for removing unwanted waves from a reception signal; a high frequency power amplifier 130 for amplifying a transmission signal; a high frequency IC 200 for demodulating a reception signal and modulating a transmission signal; and a baseband circuit (LSI) 300 for converting transmission data to I, Q signals and controlling the high frequency IC 200. The high frequency IC 200 is fabricated on a single semiconductor chip as a semiconductor integrated circuit.

Though not particularly limited, the high frequency IC 200 in this embodiment is designed for modulation and demodulation of signals in accordance with four communication schemes: GSM850, GSM900, DSC1800, and PCS1900. In correspondence, the radio communication system comprises the high frequency filter 120a for passing a reception signal for a GSM frequency band; the filter 120b for passing a reception signal in a DSC1800 frequency band; and the filter 120c for passing a reception signal in a PSC1900 frequency band. For operation on 850 MHz and 900 MHz, using the LNA 210a, the designer would have an 850 MHz filter and a 900 MHz filter and select using a switch.

The high frequency IC 200 in this embodiment is roughly composed of a reception related circuit RXC; a transmission related circuit TXC; and a control related circuit CTC which includes other circuits common to the transmission and reception such as a control circuit, a clock related circuit, and the like.

The reception related circuit RXC comprises low noise amplifiers 210a, 210b, 210c each for amplifying a reception signal; a phase divider circuit 211 for dividing an oscillating signal φRF generated by a high frequency oscillator circuit (RFVCO) 250 to generate orthogonal signals which are 90° out-of-phase from each other; demodulator circuits 212a, 212b each including a mixer for combining the reception signal amplified by the low noise amplifier 210a, 210b, 210c with the orthogonal signals generated by the phase divider circuit 211 for demodulation; high gain amplification units 220A, 220B for amplifying the demodulated I, Q signals, respectively, for delivery to the baseband circuit 300; and an offset cancel circuit 213 for canceling input DC offsets of the amplifiers within the high gain amplification units 220A, 220B.

The high gain amplification unit 220A comprises a plurality of low pass filters LPF 11, LPF 12, LPF 13, LPF 14 and gain control amplifiers PGA 11, PGA 12, PGA 13, which are alternately connected in series; and an amplifier AMP1 with a fixed gain connected at the final stage. The high gain amplification unit 220A amplifies the I signal and outputs the amplified I signal to the baseband circuit 300. Likewise, the high gain amplification unit 220B comprises a plurality of low pass filters LPF 21, LPF 22, LPF 23, LPF 24 and gain control amplifiers PGA 21, PGA 22, PGA 23, which are alternately connected in series; and an amplifier AMP2 with a fixed gain connected at the final stage, and amplifies the Q signal and outputs the amplified Q signal to the baseband circuit 300.

The offset cancel circuit 213 comprises A/D converter circuits (ADC) provided in correspondence to the gain control amplifiers PGA 11–PGA 23, respectively, for converting output potential differences, when their input terminals are short-circuited, to digital signals; DA converter circuits (DAC) each for generating an input offset voltage to reduce DC offsets in the outputs of the corresponding gain control amplifiers PGA 11–PGA 23 to zero based on the results of conversions made by the AD converters, and applying the input offset voltages to differential inputs; and a control circuit for controlling the AD converter circuits (ADC) and DA converter circuits (DAC) to perform an offset canceling operation.

The transmission related circuit TXC comprises an oscillator circuit (IFVCO) 230 for generating an oscillating signal φIF at an intermediate frequency, for example, 640 MHz; a frequency divider circuit 231 for dividing the oscillating signal φIF generated by the oscillator circuit 230 by a factor of four to generate a signal at 160 MHz; a phase divider circuit 232 for further dividing the signal divided by the frequency divider circuit 231 to generate orthogonal signals which are 90° out-of-phase from each other; modulator circuits 233a, 233b for modulating the generated orthogonal signals with the I signal and Q signal supplied from the baseband circuit 300; an adder 234 for combining the modulated signals; a transmission oscillator circuit (TX- VCO) 240 for generating a transmission signal φTX at a predetermined frequency; an offset mixer 236 for combining a feedback signal extracted by a coupler or the like from the transmission signal φTX outputted from the transmission oscillator circuit (TXVCO) 240 with a signal φRF' generated by dividing the oscillating signal φRF generated by the high frequency oscillator circuit (RFVCO) 250 to generate a signal at a frequency which is equal to the difference in frequency between the feedback signal and signal φRF'; an analog phase comparator 237a and a digital phase comparator 237b for comparing the output of the offset mixer 236 with a signal TXIF generated by the adder 234 from a combination of the modulated signals to detect a phase difference; and a loop filter 238 for generating a voltage in accordance with the outputs of the phase detector circuits 237a, 237b.

The loop filter 238 includes a resistor and a capacitor which are connected to associated external terminals of the high frequency IC 200 of this embodiment as external elements. The transmission oscillator circuit (TXVCO) 240 comprises an oscillator circuit 240a for generating transmission signals for GSM850 and GSM900; and an oscillator circuit 240b for generating transmission signals for DCS1800 and PCS1900. That is, the oscillator circuit 240a is used for a first frequency band (the GSM 850 and the GSM 900), and the oscillator 240b is used for a second frequency band (the DCS1800 and the PCS1900) which is different from the first frequency band in a frequency.

The analog phase comparator 237a and digital phase comparator 237b are provided for promoting a draw-in operation at the time the PLL circuit starts the operation. Specifically, the digital phase comparator 237b is first used for phase comparison upon start of transmission, and is subsequently switched to the analog phase comparator 237a such that the phase loop can be rapidly locked.

The chip on which the high frequency IC 200 of this embodiment is fabricated further comprises a control circuit 260 for controlling the entire chip; an RF synthesizer 261 which constitutes an RF PLL circuit together with the high frequency oscillator circuit (RFVCO) 250; an IF synthesizer 262 which constitutes an IF PLL circuit together with the intermediate frequency oscillator circuit (IFVCO) 230; and a reference oscillator circuit (VCXO) 264 for generating a clock signal φref which serves as a reference signal for these synthesizers 261, 262. The synthesizers 261, 262 are each composed of a phase comparator circuit, a charge pump, a loop filter, and the like.

Since the reference oscillating signal φref is required to be highly accurate in frequency, an external quartz oscillator is connected to the reference oscillator circuit 264. A frequency such as 26 MHz or 13 MHz may be selected for the reference oscillating signal φref.

In FIG. 1, blocks labeled fractions such as ½, ¼ and the like represent frequency divider circuits, respectively, while a block labeled BFF represents a buffer circuit. Blocks labeled SW1, SW2, SW3 represent switches which are switched for a GSM mode for transmitting and receiving signals in accordance with the GSM scheme, and a DCS/PCS mode for transmitting and receiving signals in accordance with the DCS or PCS scheme to select a frequency division ratio for a signal to be communicated. A block labeled SW4 represents a switch which is controlled ON/OFF to supply the I, Q signals from the baseband circuit 300 to the modulation mixers 233a, 233b upon transmission. These switches SW1–SW4 are controlled by signals from the control circuit 260.

The control circuit 260 is provided with a control register CRG which is set based on a signal from the baseband circuit 300. Specifically, the control circuit 260 is supplied from the baseband circuit 300 with a clock signal CLK for synchronization, a data signal SDATA, and a load enable signal LEN as a control signal for the high frequency IC 200. As the load enable signal LEN is asserted to an effective level, the control circuit 260 sequentially fetches the data signal SDATA transmitted thereto from the baseband circuit 300 in synchronism with the clock signal CLK, and sets the data signal SDATA in the control register CRG. Though not particularly limited, the data signal SDATA may be serially transmitted. The baseband circuit 300 is mainly composed of a microprocessor.

Though not particularly limited, the control register CRG may be provided with a control bit for controlling the high frequency oscillator circuit (RFVCO) 250 and intermediate frequency oscillator circuit (IFVCO) 230 to start a measurement of the frequency of the VCO; a bit field for specifying a mode such as a reception mode, a transmission mode, an idle mode, a warm-up mode, and the like. Here, the idle mode is set to enter a sleep state in which only an extremely small number of circuits are left operative while a majority of circuits including at least the oscillator circuits are inoperative, such as in a waiting time. The warm-up mode is set to start the PLL circuits immediately before transmission or reception.

In this embodiment, a transmission PLL circuit (TXPLL) for converting the frequency is composed of the phase detector circuits 237a, 237b; loop filter 238; transmission oscillator circuits (TXVCO) 240a, 240b; and offset mixer 236. In the multi-band radio communication system in this embodiment, for example, in response to a command from the baseband circuit 300, the control circuit 260 changes the frequency φRF of the oscillating signal from the high frequency oscillator circuit 250 in accordance with a channel to be used upon transmission/reception, and switches the switch SW2 in accordance with the GSM mode or DCS/PCS mode to change the frequency of the signal supplied to the offset mixer 236, thereby switching the transmission frequency.

Table 1 shows exemplary frequencies set for the oscillating signals φIF, φTX, φRF generated by the intermediate frequency oscillator circuit (IFVCO) 230, transmission oscillator circuit (TXVCO) 240, and high frequency oscillator circuit (RFVCO) 250, respectively, in the quad-band high frequency IC of this embodiment.

TABLE 1

| | IFVCO (MHz) | TXIF (MHz) | TXVCO (MHz) | RFVCO (MHz) | |
|---|---|---|---|---|---|
| | | | | RECEPTION | TRANS-MISSION |
| GSM850 | 640 | 80 | 824 | 3476 | 3616 |
| | 640 | 80 | 849 | 3576 | 3716 |
| GSM900 | 640 | 80 | 880 | 3700 | 3840 |
| | 640 | 80 | 915 | 3840 | 3980 |
| DCS1800 | 640 | 80 | 1710 | 3610 | 3580 |
| | 640 | 80 | 1785 | 3760 | 3730 |
| PCS1900 | 640 | 80 | 1850 | 3860 | 3860 |
| | 640 | 80 | 1910 | 3980 | 3980 |

As shown in Table 1, the oscillating frequency of the intermediate frequency oscillator circuit (IFVCO) 230 is set at 640 MHz for any of GSM, DCS, PCS in this embodiment. Also, the IC can use 648 MHz or 656 MHz. The oscillating signal at 640 MHz is divided by the frequency divider circuit 231 and phase divider circuit 232 by a factor of eight, respectively, to generate a carrier (TXIF) at 80 (81, 82) MHz for modulation.

On the other hand, the oscillating frequency of the high frequency oscillator circuit (RFVCO) 250 is set at different values for a reception mode and a transmission mode, respectively. In the transmission mode, the oscillating frequency fRF of the high frequency oscillator circuit (RFVCO) 250 is set, for example, in a range of 3616 to 3716 MHz for GSM850; in a range of 3840 to 3980 MHz for GSM900; in a range of 3610 to 3730 MHz for DCS; and in a range of 3860 to 3980 MHz for PCS. Then, the oscillating frequency fRF is divided by the frequency divider circuit by a factor of four for GSM; and by a factor of two for DCS and PCS. The resulting signal is supplied to the offset mixer 236 as φRF'.

Figure 10:
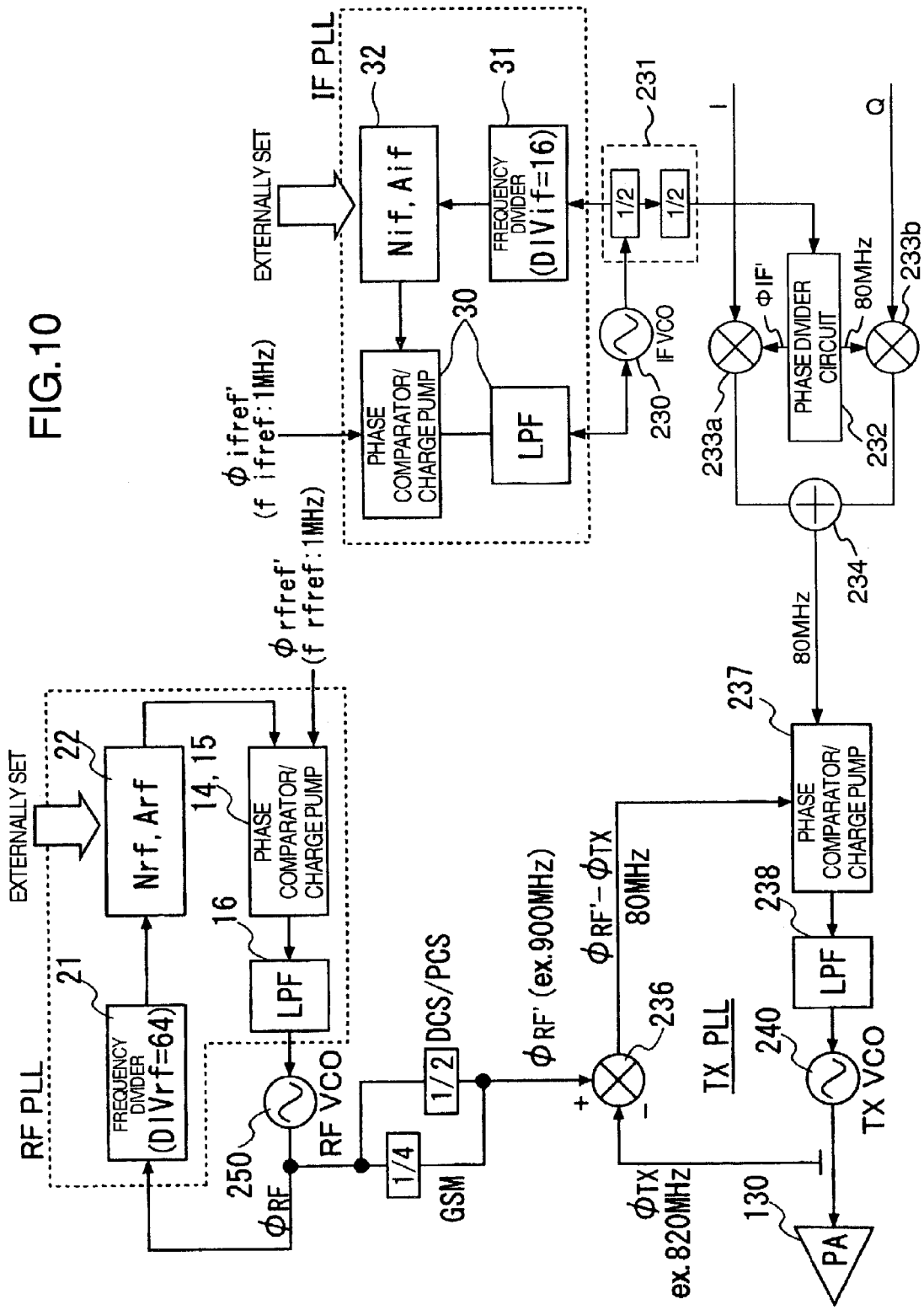
FIG. 10 is a block diagram illustrating the configuration of a main portion of a communication semiconductor integrated circuit for showing the relationship among RFPPL, TXPPL, and IFPPL.

FIG. 10 illustrates the RFPLL, TXPLL, and IFPLL extracted from the circuit of FIG. 1. As can be seen from FIG. 10, the offset mixer 236 outputs a feedback signal (fRF'-fTX) corresponding to the difference in frequency between the φRF' and the transmission oscillating signal φTX from the transmission oscillator circuit 130, and the transmission PLL (TXPLL) operates to match the frequency of the feedback signal with the frequency of the modulated signal TXIF. In other words, the TXVCO 240 is controlled to oscillate at a frequency corresponding to the difference between the frequency (fRF/4 for GSM, fRF/2 for DCS and PCS) of the oscillating signal φRF' from the RFVCO 250 and the frequency (fIF') of the modulated signal TXIF. This is the transmission operation in a system generally referred to as the offset PLL system.

Figure 2:
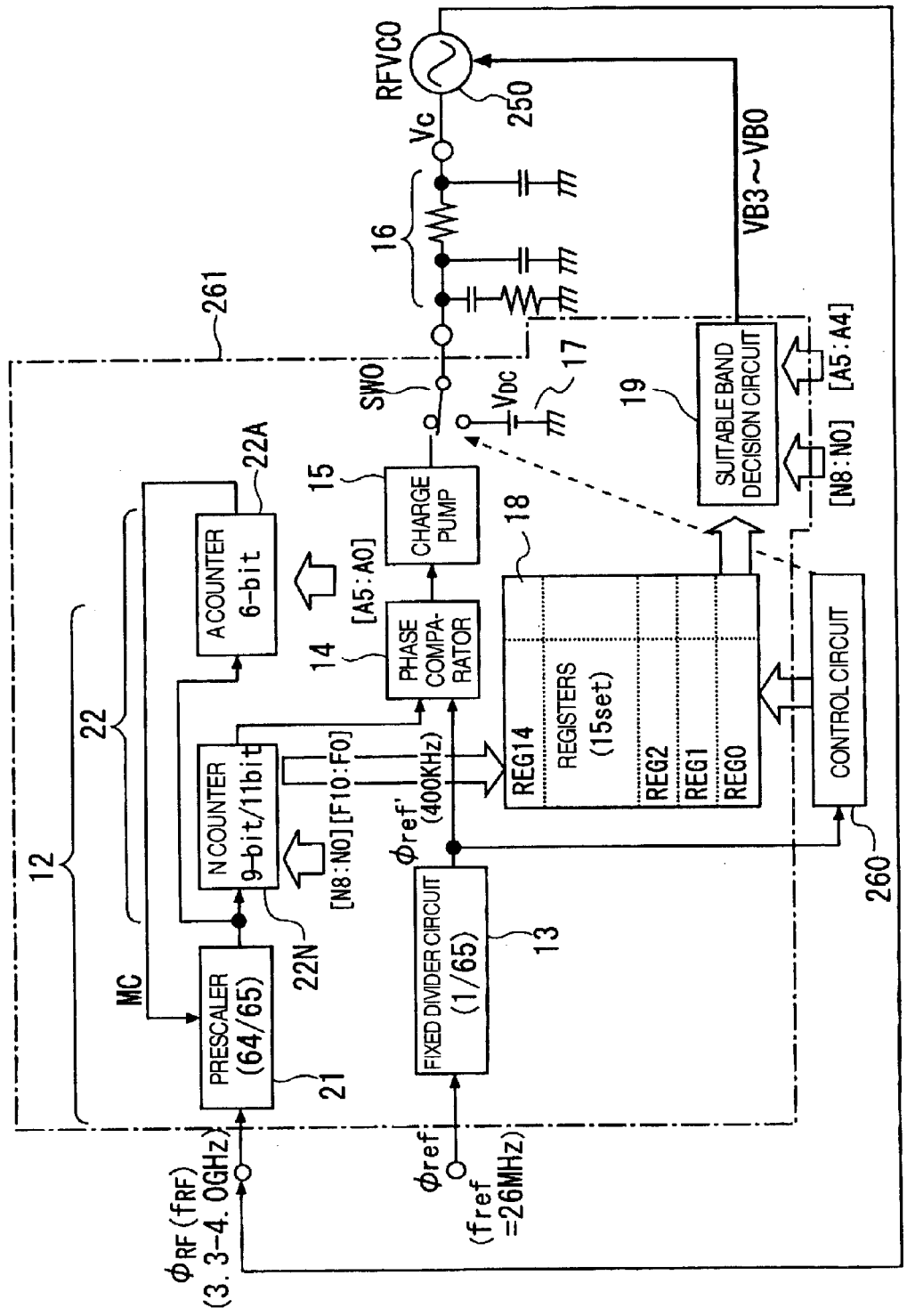
FIG. 2 is a block diagram illustrating one embodiment of a PLL circuit including an RFVCO in the multi-band communication semiconductor integrated circuit (high frequency IC) in the embodiment of FIG. 1.

FIG. 2 illustrates a specific example of a PLL circuit which has a function of measuring the frequency of the VCO, and a function of correcting the VCO for the frequency characteristic based on the result of the measurement. The PLL circuit illustrated in FIG. 2 comprises a high frequency oscillator circuit (RFVCO) 250; a variable frequency divider circuit 12 for dividing the oscillating signal φRF from the RFVCO 250; a fixed frequency divider circuit 13 for dividing the reference oscillating signal φref from the reference oscillator circuit 264 by a factor of 65; a phase comparator 14 for comparing in phase the signal divided by the variable frequency divider circuit 12 with the signal divided by the fixed frequency divider circuit 13 to output a voltage UP, DOWN in accordance with the difference in phase between the two signals; a charge pump 15; and a loop filter 16. The charge pump 15 charges up a capacitive element of the loop filter 16 to output a control voltage Vc for the RFVCO 250 which responsively oscillates at a predetermined frequency. In this manner, a PLL loop is formed. The capacitive element or capacitor and a resistor, which constitute the loop filter 16, are connected as external elements.

As illustrated in FIG. 2, the PLL circuit in this embodiment comprises a switch SW0 placed between the charge pump 15 and loop filter 16 for supplying the loop filter 16 with a predetermined DC voltage VDC, in place of the voltage Vc from the charge pump 15, upon measurement of the frequency and PLL draw-in operation; and a DC voltage source 17 for generating a DC voltage VDC which is applied to the charge pump 15. The PLL circuit further comprises a storage circuit 18 comprised of registers or the like for storing values counted by the variable frequency divider circuit 12; a suitable band decision circuit 19 for comparing the frequency values stored in the storage circuit 18 with set values N8–N0 and A5, A4 set in the counter 22 from the outside to generate a band switching signal VB3–VB0 for the RFVCO 250; and the like. The suitable band decision circuit 19 may be part of the control circuit 260.

For measuring the frequency, the DC voltage VDC supplied to the loop filter 16 through the switch SW0 may have any voltage value as long as it is within an effective variable range of the control voltage Vc. In this embodiment, an upper limit value (Vcp-max) in the variable range of the control voltage Vc is selected for the DC voltage VDC. During a measurement of the frequency, the DC voltage VDC is maintained at the same value even when a band is switched to another. The switch SW0, variable frequency divider circuit 12, storage circuit 18, and suitable band decision circuit 19 are controlled by the control circuit 260. The variable frequency divider circuit 12, fixed frequency divider circuit 13, phase comparator 14, charge pump 15, storage circuit 18, and suitable band decision circuit 19 make up the RF synthesizer 261 illustrated in FIG. 1.

The RFVCO 250 comprises, for example, a Colpitts oscillator circuit using an LC resonance circuit. A plurality of capacitive elements, each forming part of the LC resonance circuit, are arranged in parallel through respective switching elements associated therewith. The switching elements may be selectively turned on with the band switching signal VB3–VB0 to switch a connected capacitive element, i.e., the value C of the LC resonance circuit, thereby switching the oscillating frequency step by step. On the other hand, the RFVCO 250 has a variable capacitance diode as a variable capacitance element, the capacitance of which is changed by the control voltage Vc from the loop filter 16 to continuously change the oscillating frequency.

Figure 4:
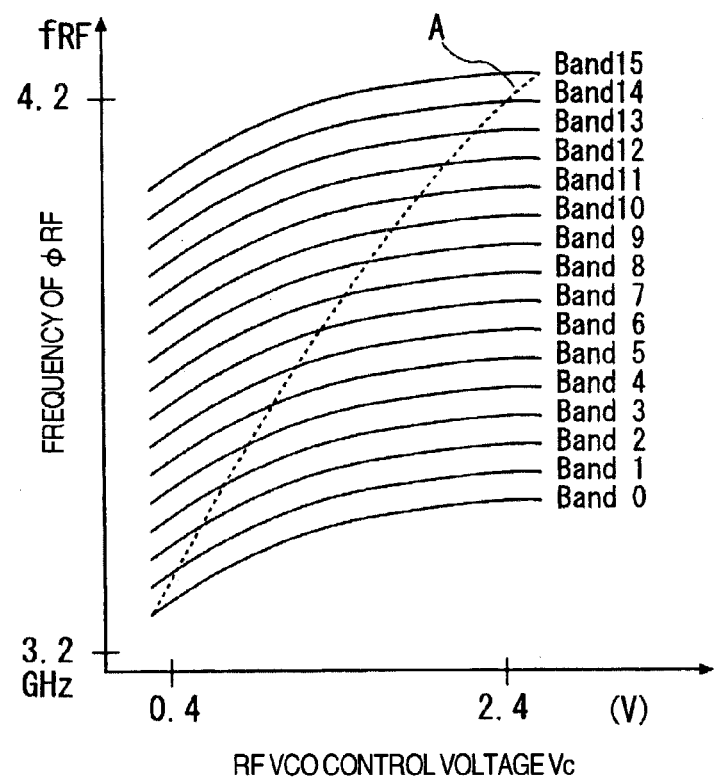
FIG. 4 is a graph showing the relationship between a control voltage Vc and an oscillating frequency fRF when a variable frequency range for the RFVCO is continuously changed and when it is changed intermittently in a plurality of bands.

When a frequency range covered by the VCO is extended only with a change in the capacitance of the variable capacitance diode through the control voltage Vc, a resulting Vc-fRF characteristic exhibits an abrupt slope, as indicated by a broken line A in FIG. 4, to cause an increase in the sensitivity of the VCO, i.e., the ratio of a frequency changing amount to a control voltage changing amount (Δf/ΔVc), so that the VCO becomes more vulnerable to noise. In other words, slight noise introduced into the control voltage Vc would result in a large change in the oscillating frequency fRF of the VCO.

To solve this problem, the RFVCO 250 in this embodiment comprises a plurality of capacitive elements, which form part of the LC resonance circuit, in parallel to switch a used capacitive element in n stages with the band switching signal VB3–VB0 to change the value C, to control the oscillation along a plurality of Vc-fRF characteristic curves as indicated by solid lines in FIG. 4. Moreover, in this embodiment, the storage circuit 18 and suitable band decision circuit 19 provided in the RFVCO 250 eliminate a adjustment operation called a frequency alignment which has been required in conventional PLL circuits.

Specifically, a conventional PLL circuit operates the VCO to measure the frequency and align the frequency such that each of a plurality of Vc-fRF characteristic curves has a predetermined initial value and a predetermined slope even when a VCO is tuned to have a plurality of Vc-fRF characteristic curves, for example, as shown in FIG. 4. On the contrary, the PLL circuit in this embodiment previously switches the switch SW0 to apply the RFVCO 250 with the predetermined DC voltage VDC, and measures the frequency in each band for storage in the storage circuit 18. For an actual use, the PLL circuit compares the set values N8–N0 and A5, A4 applied to the counter 22 from the outside in accordance with a specified band with the measured frequencies stored in the storage circuit 18 to select only one which can cover the frequency range of the specified band from the plurality (n) of Vc-fRF characteristic curves, as shown in FIG. 4, to switch the RFVCO (capacitive element) to oscillate in accordance with the selected characteristic curve.

According to this strategy, the RFVCO may be designed with n Vc-fRF characteristic curves, each of which covers a frequency range slightly wider than an intended frequency range in consideration of variations, and which slightly overlap (preferably, half by half) the frequency ranges with adjacent ones, as shown in FIG. 4, to provide without fail a characteristic curve which can cover a specified frequency range. Therefore, a Vc-fRF characteristic curve corresponding to a particular specified band may be selected based on the actual characteristic found by a measurement, thereby eliminating the alignment of the frequency and a previous one-to-one correspondence of a used band to a switching state of the RFVCO.

The variable frequency divider circuit 12 comprises a prescaler 21 for dividing the oscillating signal of the RFVCO 250; and a modulo counter 22 comprised of a first counter 22N and a second counter 22A for further dividing the signal divided by the prescaler 21.

The division of the oscillating signal by the prescaler 21 and modulo counter 22 is a known technique. The prescaler 21 can divide the oscillating signal at two different frequency division ratios, for example, 1/64 and 1/65. One frequency division ratio is switched to the other by a count end signal of the second counter 22A. The first counter 22N and second counter 22A are programmable counters. The first counter 22N is loaded with the quotient (integer part) resulting from a division of a desired frequency (the oscillating frequency fRF of the VCO desired as the output) by the frequency fref' of the reference oscillating signal φref' and the first frequency division ratio (64 in the embodiment) of the prescaler 21, while the second counter 22A is loaded with the residue (MOD) resulting from the division. Each of the counters terminates the counting as it has counted the value set therein, and again begins counting up to the set value.

Specifically, assuming, for example, that the reference oscillating signal φref' has the frequency fref' at 400 kHz, and a desired oscillating frequency fRF of the VCO is at 3789.6 MHz, the first counter 22N is loaded with the value N equal to "148" while the second counter 22A is loaded with the value A equal to "2" since 3789.6/(0.4*64)=148 and a residue of 2. As the prescaler 21 and modulo counter 22 operate with such values set in the respective counters, the prescaler 21 first divides the oscillating signal of the RFVCO 250 by a factor of 64, and the second counter 22A counts the output up to "2" which is set therein, at which time the second counter 22A outputs a count end signal MC which causes the prescaler 21 to switch the operation. Consequently, the prescaler 21 divides the oscillating signal of the RFVCO 250 by a factor of 65 until the second counter 22A again counts the output of the prescaler 21 up to the set value "2."

The foregoing operation permits the modulo counter 22 to divide the oscillating signal not only in an integer ratio but also in a fractional ratio. The PLL circuit in this embodiment applies a feedback to match the frequency of the output of the first counter 22N with the frequency fref' (400 kHz) of the reference oscillating signal φref' to control the oscillation of the RFVCO 250. Therefore, in the foregoing specific example in which the first counter 22N is loaded with the value N equal to "148" and the second counter 22A with the value A equal to "2," the oscillating frequency fRF of the RFVCO 250 is calculated to be 3789.6 MHz as follows:

$$fRF=(64\times148+2)\times fref'=9474\times400=3789600$$

It should be noted that the first counter 22N and second counter 22A are actually comprised of binary counters, so that the value N set in the first counter 22N and the value A set in the second counter 22A are applied in binary codes. Though not particularly limited, in this embodiment, the first counter 22N operates as a 9-bit counter, while the second counter 22A as a 6-bit counter during a PLL operation, so that the value set in the first counter 22N is given by a 9-bit code N8–N0, while the value set in the second counter 22A is given by a 6-bit code A5–A0.

Further, in this embodiment, the first counter 22N can operate also as an 11-bit counter for measuring the frequency. The RFVCO 250 can switch the oscillating frequency in 16 bands, i.e., in 16 stages, so that the storage circuit 18 comprises 15 registers REG0–REG14 for storing frequencies measured for the 16 bands, respectively. So, it is not necessary to measure every RFVCO band. If the RFVCO has 16 switched bands, it is only necessary to measure calibration values for 15 bands (for example bands #0 up to #14, not measuring band #15). For the RFVCO, we can measure bands #0, #1, #2, #3 up to band #14. Alternatively, we can use a 'band-skipping' system, measuring band #0, #2, #4, #6, . . . up to #14. The suitable band decision circuit 19 in turn comprises an 11-bit comparator for comparing a value stored in the register REG0–REG14 of the storage circuit 18 with the 9-bit code N8–N0 set in the first counter 22N and the upper two bits A5, A4 of the 6-bit code A5–A0 set in the second counter 22A to output a 4-bit code VB3–VB0 as a band switching signal for the RFVCO 250.

Upon measurement of the frequency, the control circuit 260 generates the switching signal VB3–VB0 to select 16 bands in order and outputs the switching signal VB3–VB0 to the RFVCO 250. Further, upon measurement of the frequency, the control circuit 260 controls the first counter 22N to operate as an 11-bit counter, and to count the number of clocks in a long term, for example, four periods of the reference oscillating signal φref', rather than one period. Also, upon measurement of the frequency, the control circuit 260 controls the second counter 22A to stop the operation such that the frequency division ratio of the prescaler 22 is not switched. In this way, the prescaler 22 divides the oscillating signal of the VCO only by a factor of 64 for measuring the frequency.

In this embodiment, the control circuit 260 operates the first counter 22N for four periods of the reference oscillating signal φref' rather than one period during a measurement of the frequency in order to increase the accuracy of measurement. Specifically, if a maximum error possibly occurring in the counter 22N in a measurement for one period of the reference oscillating signal φref', i.e., one pulse count error occurs in the counter 22N in a measurement for one period of φref', the error at this time is enlarged by a factor of 64 which is the frequency division ratio of the prescaler 21 due to the provision of the prescaler 21. For this reason, the maximum error of the counter 22N amounts to 25.6 MHz (400 kHz×64) when the reference oscillating signal φref' is at 400 kHz. However, the error occurring in the counter 22N in a measurement for four periods is reduced to approximately 6.4 MHz which is one quarter as much.

The 11-bit counted value provided by the first counter 22N upon measurement of the frequency is stored in one of the registers in the storage circuit 18. The stored value, the upper nine bits of which are regarded as the quotient (integer part), is compared with the code N8–N0 set in the first counter 22N supplied from the outside by the suitable band decision circuit 19 during a PLL operation. Also, the lower two bits of the value stored in the register of the storage circuit 18 are regarded as a residue (fraction part) and are compared with the upper two bits A5, A4 of the code A5–A0 set in the second counter 22A supplied from the outside by the suitable band decision circuit 19.

The suitable band decision circuit 19, which is composed of a comparator, an exclusive OR gate, and the like, decides a band to be used by the RFVCO 250 from the result of comparison of the values stored in the respective registers REG0–REG15 of the storage circuit 18 with the set code N8–N0 and the upper two bits A5, A4 of the set code A5–A0, generates the band switching code VB3–VB0 for selecting the decided band, and supplies the band switching code VB3–VB0 to the RFVCO 250. When the RFVCO 250 is used in a PLL circuit for use in a communication system such as GSM, the respective bands are set at intervals of 400 kHz, for example, in compliance with the channel intervals of GSM.

The following description will focus on a procedure for measuring the frequency and a correcting the frequency characteristic, under the control of the control circuit 260, in the PLL circuit of this embodiment. The measurement of the frequency for the RFVCO 250, and the correction for the frequency characteristic based on the result of the measurement are made, for example, each time a predetermined command is inputted from the baseband circuit 300 in an idle mode.

Upon start of a measurement of the frequency for the RFVCO 250, the control circuit 260 first switches the switch SW0 to supply the loop filter 16 with the DC voltage VDC. Then, the control circuit 260 waits for the voltage Vc of the loop filter 16 to stabilize as well as for the oscillating frequency of the RFVCO 250 to stabilize. Next, the control circuit 260 fixes the frequency division ratio of the prescaler 21 to 1/64, and sets the first counter 22N to operate as an 11-bit counter. Next, the control circuit 260 references a pointer indicative of a selected band to output the code VB3–VB0 for selecting a band of the RFVCO 250. Here, the band selected first is, for example, BAND0 which accounts for the lowest frequency range.

Next, the control circuit 260 forces the first counter 22N to count for four periods of the reference oscillating signal φref', and stores the counted value of the first counter 22N in one of the registers of the storage circuit 18. The register first loaded with the counted value is the first register REG0. Then, the control circuit 260 determines whether or not the frequencies have been measured for all the bands. If not, the control circuit 260 increments the pointer indicative of the selected band by two (+2) and repeats the foregoing operation.

Subsequently, as the PLL circuit is supplied with a frequency setting value in accordance with a used channel from the baseband circuit upon start of transmission/reception in a standby state, the suitable band decision circuit 19 decides a band to be used by the RFVCO 250 based on the frequency setting value from the result of comparison of the stored values in the respective registers REG0–REG15 of the storage circuit 18 with the set code N8–N0 and A5, A4. Then, the suitable band decision circuit 19 supplies the RFVCO 250 with the band selection signal VB3–VB0 for correcting the frequency characteristic.

The high frequency IC 200 in the embodiment illustrated in FIG. 1 also has a function of measuring the frequencies of the intermediate frequency VCO (IFVCO) 230 and transmission VCO (TXVCO) 240, and a function of correcting the frequency characteristics of these VCOs 230, 240 based on the result of the measurement. In addition, these functions can be executed by a common circuit to limit an increase in the circuit scale.

Figure 3:
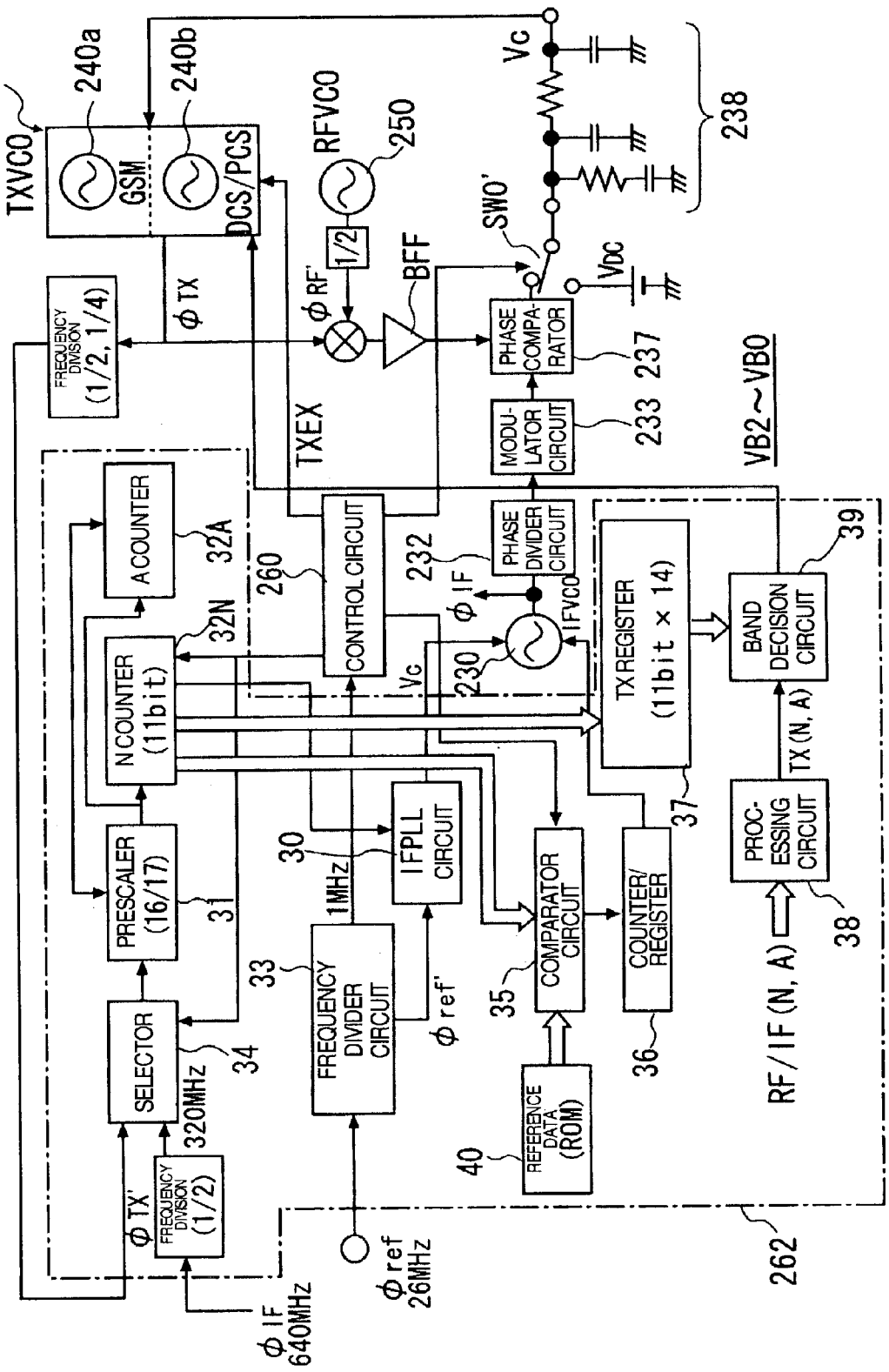
FIG. 3 is a block diagram illustrating one embodiment of a PLL circuit including an IFVCO and a PLL circuit including a TXVCO in the multi-band communication semiconductor integrated circuit (high frequency IC) in the embodiment of FIG. 1.

The following description will focus on an embodiment of the PLL circuit which implements the function of measuring the frequencies of the IFVCO 230 and TXVCO 240, and the function of correcting the frequency characteristics of the IFVCO 230 and TXVCO 240 based on the result of the measurement with reference to FIG. 3. In FIG. 3, circuits identical to those shown in FIGS. 1 and 2 are designated the same reference numerals, and repetitive description will be omitted.

As illustrated in FIG. 3, an IF synthesizer 262 is similar in configuration to the RF synthesizer 261 shown in FIG. 2. Specifically, the IF synthesizer 262 comprises a prescaler 31 which can divide the oscillating frequency by a factor of 16 or 17; an N counter 32N and an A counter 32A which make up a modulo counter; a fixed frequency divider circuit 33; and the like. In FIG. 3, circuits corresponding to the phase comparator 14, charge pump 15, switch SW0, and loop filter 16 shown in FIG. 2 are represented as an IF PLL circuit 30. The fixed frequency divider circuit 33 is designed to generate an operating clock (1 MHz) for the control circuit 260, other than the reference oscillating signal φref' at 400 KHz. The operation of the N counter 32N and A counter 32A is similar to the embodiment illustrated in FIG. 2, so that description thereon is omitted.

The IF synthesizer 262 also comprises a selector 34 for selectively supplying the prescaler 31 with a signal generated by dividing the intermediate frequency signal φIF or a signal generated by dividing the oscillating signal φTX from the TXVCO 240 in accordance with a signal from the control circuit 260; a comparator circuit 35 for comparing the value counted by the N counter 32N with reference data (IF frequency information) stored in a ROM 40 upon measurement of the frequency of the IFVCO; a counter/register 36 for holding information on a band to be used by the IFVCO 230 based on the result of the comparison in the comparator circuit 35; a register 37 for storing the value counted by the N counter 32N upon measurement of the frequency of the TXVCO; a processing circuit 38 for calculating a target oscillating frequency value TX(N, A) for the TXVCO based on frequency setting values RF/IF(N, A) for the RFVCO and IFVCO supplied from the baseband circuit; and a band decision circuit 39 for comparing the value calculated by the processing circuit 38 with the value stored in the register 37 to generate a code VB2–VB0 for specifying a band used in the TXVCO 240.

In FIG. 3, a switch SW0' can supply the loop filter 238 with a predetermined DC voltage VCD in place of the voltage Vc from the charge pump upon measurement of the frequency of the TXVCO 240 or in a PLL draw-in operation. A DC voltage source 217 generates the DC voltage VDC applied to the charge pump 328. No circuit corresponding to the charge pump 15 shown in FIG. 2 is included in FIG. 3 because an output stage of a phase comparator circuit 237 has a function similar to the charge pump. Either a TXVCO 240a for GSM or a TXVCO 240b for DCS/PCS is made operative by a control signal from the control circuit 260 upon measurement of the frequency and upon transmission.

Figure 5:
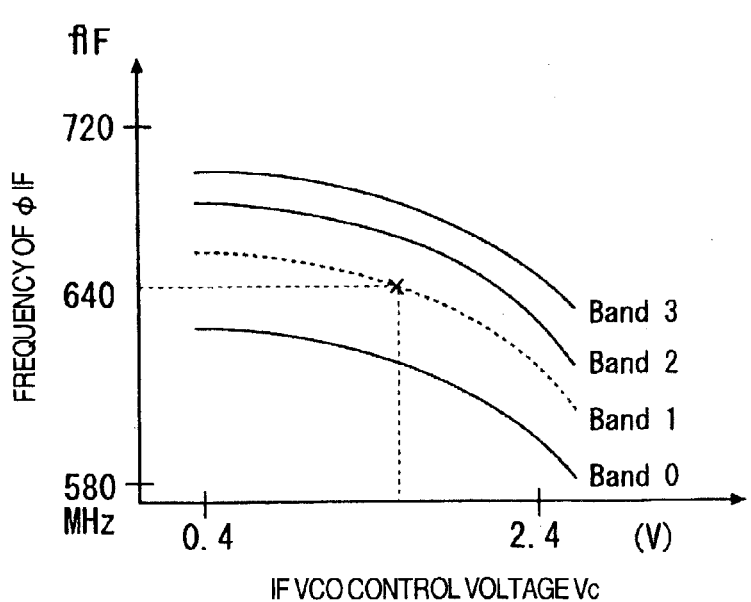
FIG. 5 is a graph showing the relationship between the control voltage Vc and oscillating frequency fRF when the variable frequency range of the IFVCO is changed intermittently in a plurality of bands.
Figure 6:
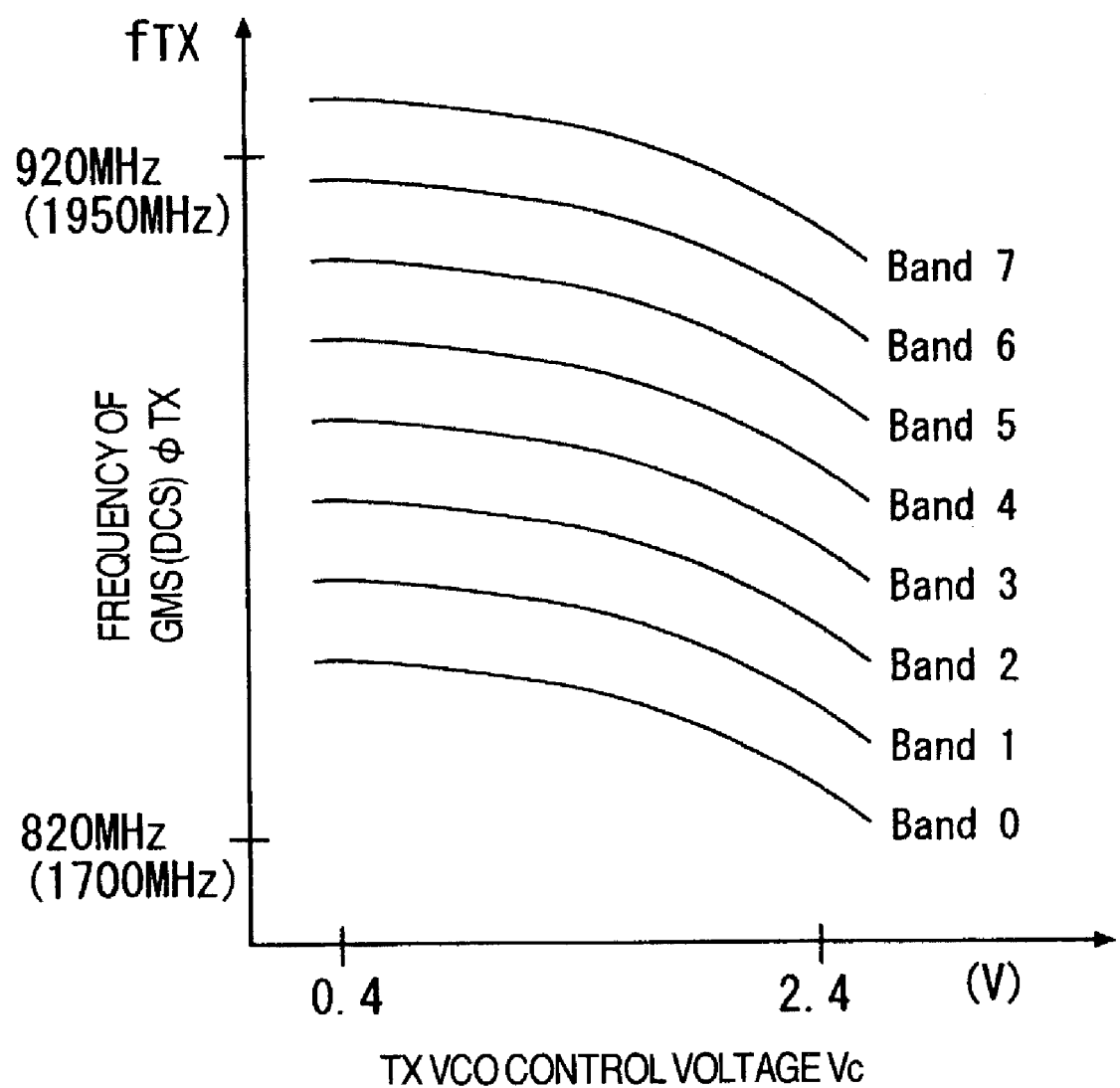
FIG. 6 is a graph showing the relationship between the control voltage Vc and oscillating frequency fRF when a variable frequency range of the TXVCO is changed intermittently in a plurality of bands.

As illustrated in FIG. 5, the target value of four bands can be in a register inside the radio chip, programmed from baseband.

The TXVCO 240 is configured to operate in accordance with the characteristic in one of eight bands, as illustrated in FIG. 5. The processing circuit 38 is provided for determining a band to be used by the TXVCO from the frequency setting values RF/IF(N, A) for the RFVCO and IFVCO supplied from the baseband circuit 300, so that the baseband circuit 300 need not supply the frequency setting value for the TXVCO, and a band to be used can be decided for the TXVCO in a short time. The band decision circuit 39 determines a band to be used from the measured frequencies of the TXVCO stored in the register 37, and the target oscillating frequency TX(N, A) for the TXVCO calculated by the processing circuit 38.

Now, description will be made on a specific technique for determining a band to be used by the TXVCO 240 from the frequency setting values RF/IF(N,A) for the RFVCO 250 and IFVCO 230, supplied from the baseband circuit 300.

As previously described in connection with FIG. 10, the frequency fTX of the TXVCO 240 is expressed by the difference between the frequency fRF' of the signal φRF' generated by dividing the oscillating signal φRF of the RFVCO 250 and the frequency fIF' of the signal φIF' generated by dividing the oscillating signal φIF of the IFVCO 230, i.e., fTX=fRF'-fIF'. Assuming herein that frequency setting values in the counter 22 of the RFPLL are NRF, ARF; frequency setting values in the counter 32 of the IFPLL are NIF, AIF; the division ratios of the frequency division circuit 21 of the RFPLL and the frequency division circuit 31 of the IFPLL are DIVrf, DIVif, respectively, and the frequencies of the reference signal φref' supplied to the phase comparator circuits 14, 30 of the RFPLL and IFPLL are frfre', fifref', the oscillating frequencies fRF, fIF of the RFVCO 250 and IFVCO 230 are respectively expressed by:

$$fRF=(Nrf \times DIVrf + Arf) \times frfref'$$

$$fIF=2 \times (Nif \times DIVif + Aif) \times fifref'$$

The frequencies fRF', fIF' are respectively expressed by:

$$fRF'=fRF/4 \text{ (GSM)}$$

$$fRF'=fRF/2 \text{ (DCS, PCS)}$$

$$fIf'=fIF/8$$

From the above equations and the aforementioned equation fTX=fRF'-fIF', for GSM, fTX can be calculated as follows:

$$fTX = \{(Nrf \times DIVrf + Arf) \times frfref' \times 1/4\} -$$
$$\{2 \times (Nif \times DIVif + Aif) \times fifref' \times 1/8\} =$$
$$Nrf \times DIVrf \times frfref' \times 1/4 - Nif \times DIVif \times fifref' \times 1/4 +$$
$$(Arf \times frfref' \times 1/4 - Aif \times fifref' \times 1/4)$$

Here, for example, when frfref' and fifref' are both at 1 MHz; the division ratios DIVrf, DIVif of the frequency division circuits 21, 31 are "64" and "16"; and GSM900 is selected so that NRF=56, ARF=16 are set, for example, for the frequency setting values in the counter 22 of the RFPLL, and NIF=20, AIF=0 are set for the frequency setting values in the counter 32 of the IFPLL, fTX is calculated from the foregoing equation as follows:

$$fTX =$$
$$(56 \times 64 \times 1 \times 1/4) - (20 \times 16 \times 1 \times 1/4) + (16 \times 1 \times 1/4 - 0 \times 1 \times 1/4) =$$
$$896 - 80 + 4 = 820 \text{ (HMz)}$$

It should be noted that the above description shows an example of calculation using the above algorithm and, in a real system using the above algorithm, frfref' and fifref' may be derived from the reference frequency for the RF/IF PLL in use.

Figure 11:
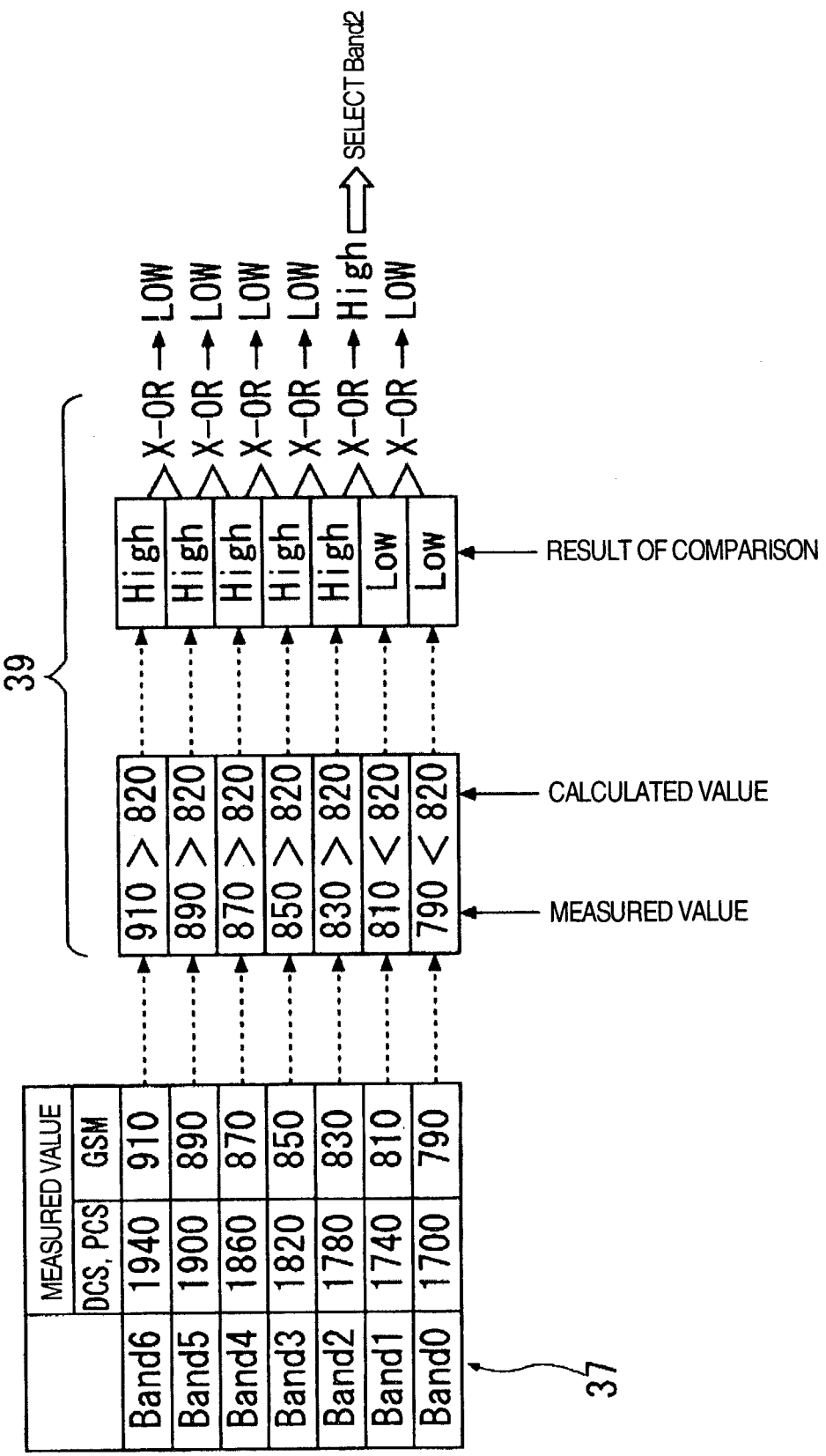
FIG. 11 is an explanatory diagram schematically showing how a frequency band is determined for the TXVCO.

On the other hand, when frequency values 910, 890, 870, 80, 830, 810, 790, resulting from the aforementioned measurement, have been stored in the register 37 as measured values as shown in FIG. 11, the comparator in the suitable band decision circuit 39 compares the value (820) calculated by the processing circuit 38 with each of the measured values in the register 37 in order. Then, the results of the comparisons (High or Low) are X-ORed with one another, and a frequency band corresponding to the stored value having the X-OR result "High" is selected as a band to be used by the TXVCO 250.

Figure 12:
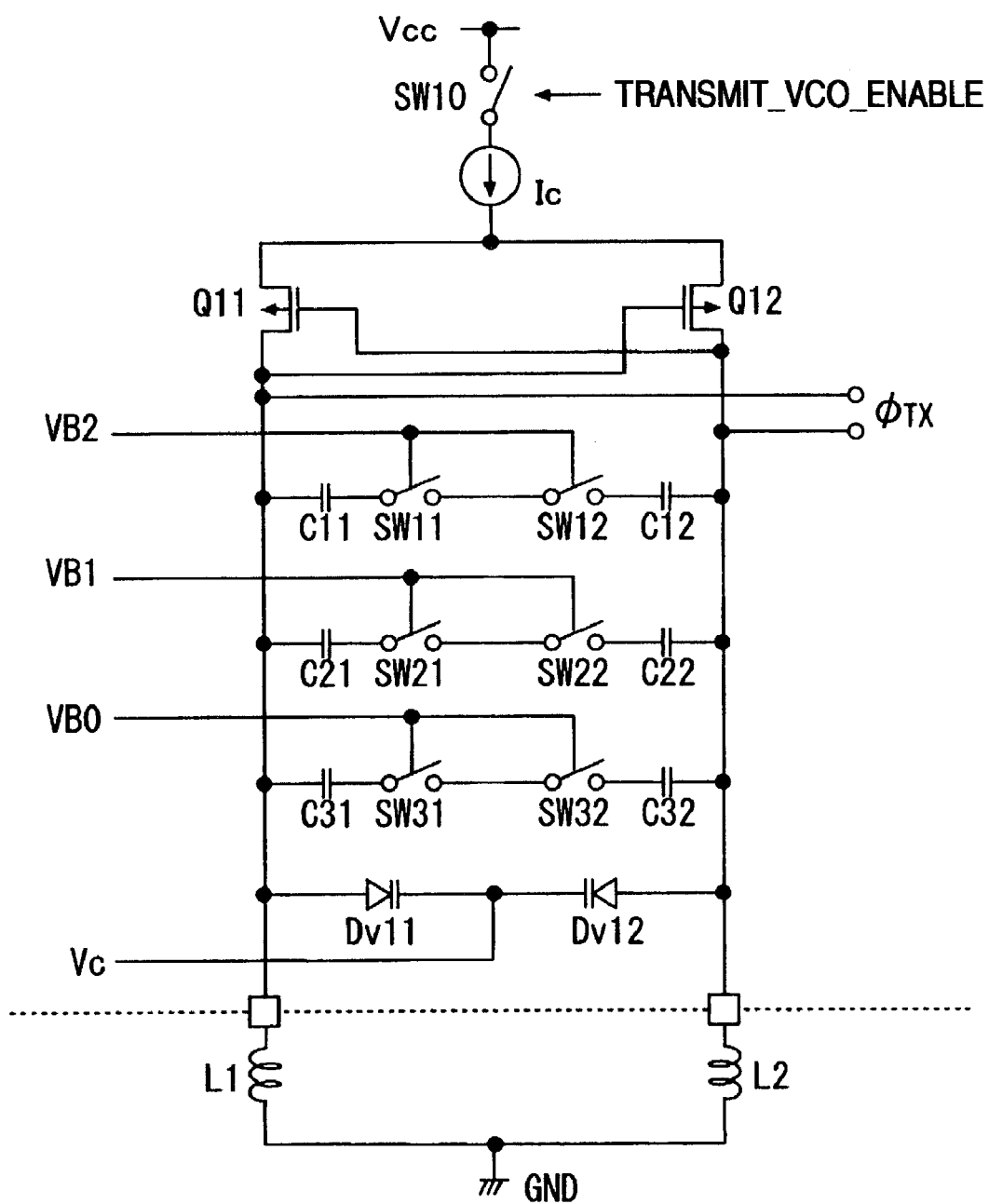
FIG. 12 is a circuit diagram illustrating a specific example of a circuit which implements the transmission VCO (the tuning inductors OFF-chip)
Figure 13:
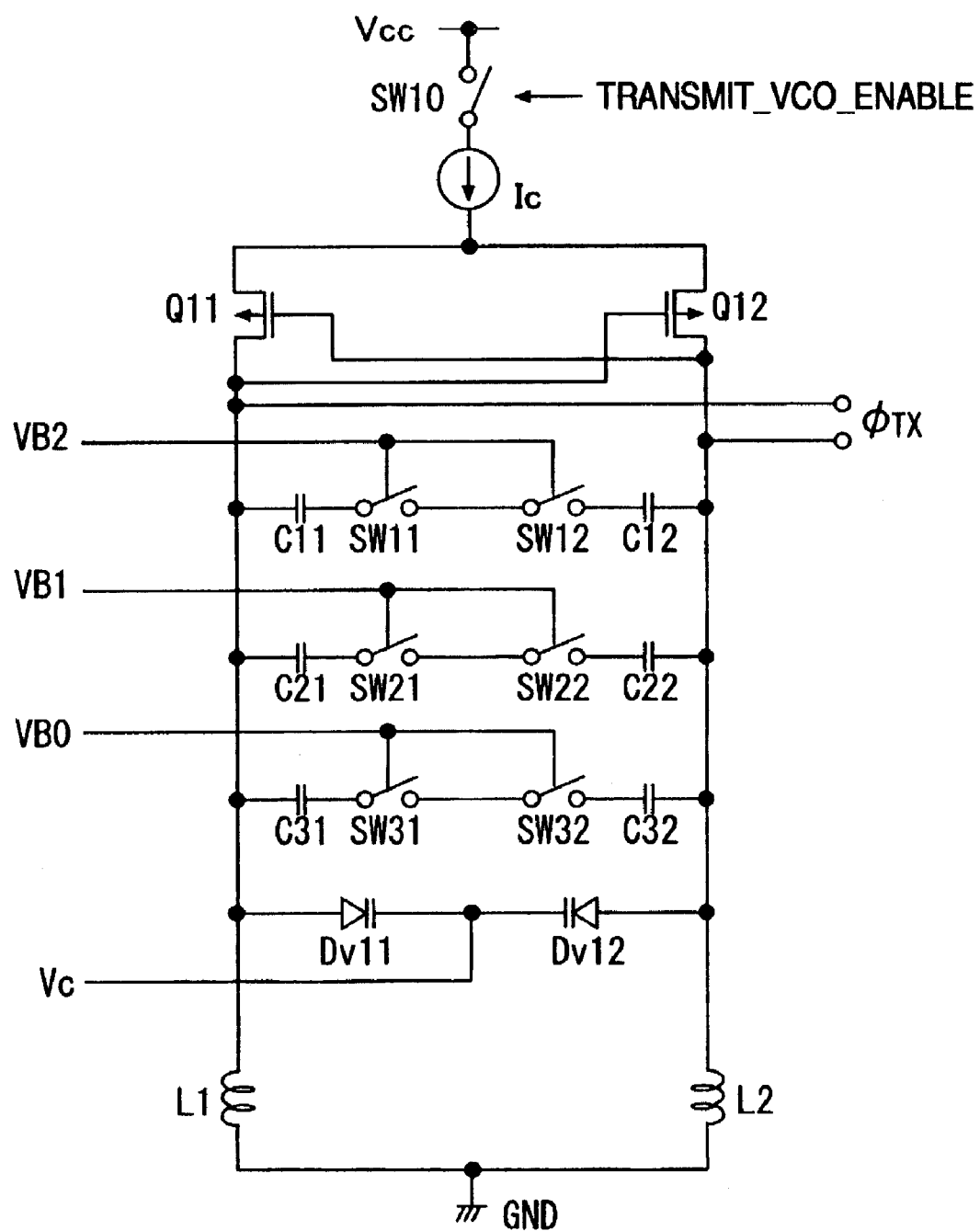
FIG. 13 is a circuit diagram illustrating a specific example of a circuit which implements the transmission VCO (the tuning inductors ON-chip).

FIGS. 12 and 13 illustrate one embodiment of the LC resonance oscillator circuit which is used as the TXVCO 240a, 240b forming part of the transmission related circuit TXC. As illustrated in FIGS. 12 and 13, the oscillator circuit in this embodiment comprises a pair of P-channel MOS transistors Q11, Q12 which have commonly connected sources, and gates and drains cross-coupled to each other; a regulated current source Ic connected between the common source of the transistors Q1, Q2 and a power supply voltage terminal Vcc; a switch SW10 connected in series with the regulated current source Ic; inductors (coils) L1, L2 connected between the drains of the respective transistors Q1, Q2 and a ground point GND, respectively; a first series circuit including a capacitor C11 connected in series between the drain terminals of the transistors Q11, Q12, switches SW21, SW22, and a capacitor C22; a second series circuit connected in parallel with the first series circuit and including a capacitor C21, switches SW21, SW22, and a capacitor 22; a third series circuit connected in parallel with the first series circuit and including a capacitor C31, switches SW31, SW32, and a capacitor C32; and varactor diodes Dv1, Dv2 as variable capacitive elements connected in series between the drain terminals connected in series between the drain terminals of the transistors Q11, Q12.

The switches SW11–SW32 are controlled to turn ON/OFF by the band selection signal VB2–VB0 from the suitable band decision circuit 39 to change the oscillating frequency step by step. Each of the varactor diodes Dv11, Dv12 is applied with the control voltage Vc at one terminal thereof from the loop filter 238 shown in FIG. 3 to continuously control the frequency.

Specifically, as a larger number of the switches SW11–SW32 are turned on, the capacitance connected between the drains of the transistors Q11, Q12 becomes larger to reduce the oscillating frequency. On the other hand, as a smaller number of the switches SW11–SW32 are turned on, the oscillating frequency becomes higher. As the switch SW10 connected in series with the regulated current source Ic is turned on, the oscillator circuit begins an oscillating operation, and as the switch SW10 is turned off, the oscillator circuit stops the oscillating operation. Instead of providing the switch SW10, the regulated current source Ic may be directly controlled ON/OFF. The switch SW10 is controlled by a switching signal TRANSMIT_VCO_ENABLE outputted from the control circuit 260.

In this embodiment, LC resonance oscillator circuits, which form part of the reception VCO 250 and intermediate frequency VCO 230, use inductors mounted on the chip. As for the transmission VCOs 240a, 240b, the inductors L1, L2 of the transmission VCO 240a are externally mounted, and the inductors L1, L2 of the transmission VCO 240b are built in the IC. The varactor diodes Dv11, Dv12 may be implemented by P-channel MOS transistors.

As shown in Table 1, the frequency of the IFVCO may be essentially constant. However, in an actual system, harmonics of the signal generated by the reference oscillator circuit 264, and beat noise corresponding to the difference in frequency between the harmonics and the intermediate frequency signal can superimpose on the oscillating signal generated by the IFVCO 230, or introduce into the modulator circuit 233 to degrade the CN ratio, depending on the frequency of a used channel. Even in such a situation, the frequency of the IFVCO may be changed, for example, from 640 MHz to 648 MHz or 656 MHz to reduce the noise and improve the CN ratio. It is therefore quite effective to configure the IFVCO 230 to operate in a plurality of bands as in this embodiment, so that a band to be used can be selected from the available bands.

Next, referring to FIG. 7, description will be made on the timings at which the frequency is measured for each VCO, and the frequency characteristic is corrected (a band to be used is decided) based on the result of the measurement in the radio communication system which employs the high frequency IC in this embodiment.

Figure 7:
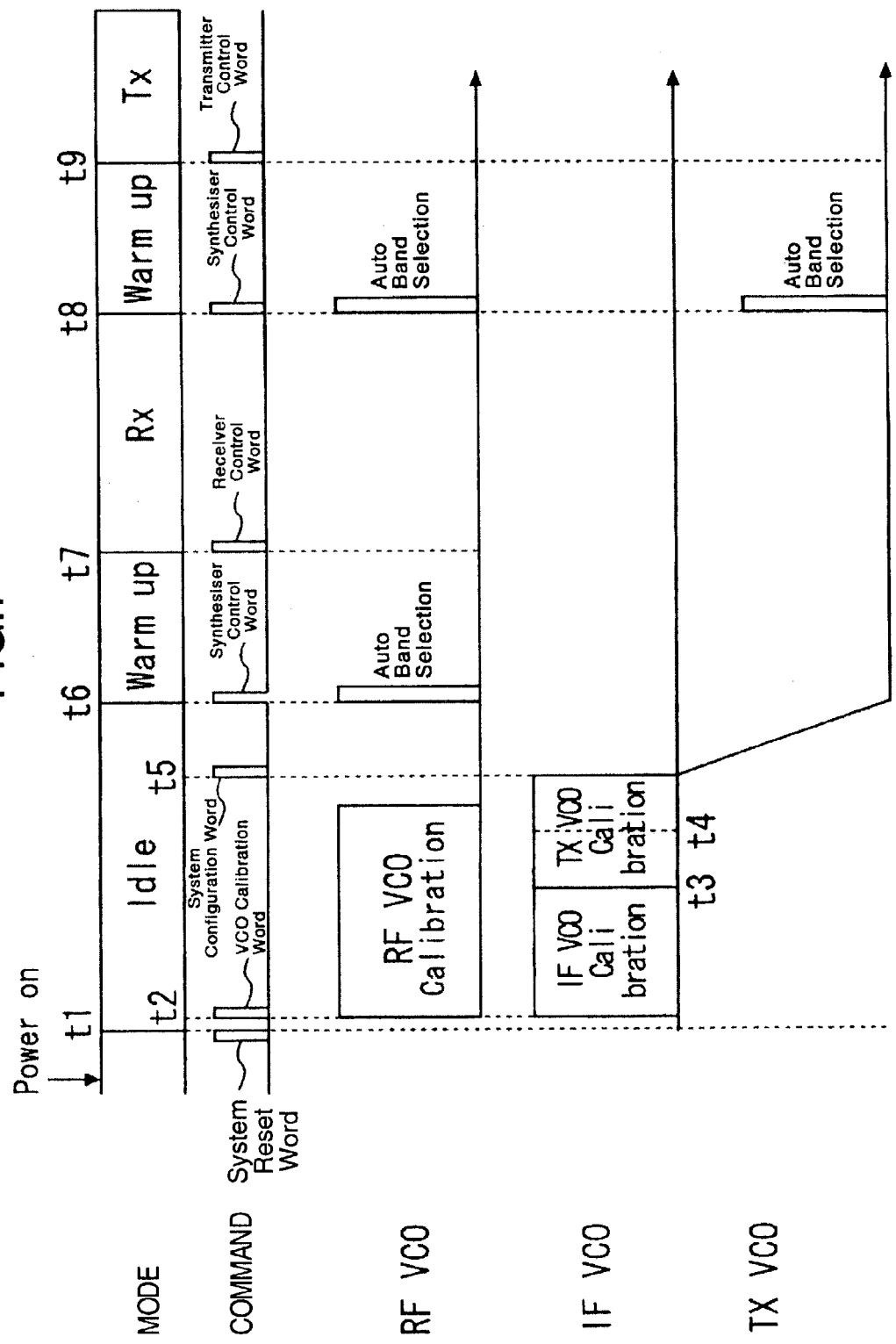
FIG. 7 is a timing chart showing timings at which the frequency of each VCO is measured, and the frequency characteristic is corrected (a band to be used is determined) based on the result of the measurement in a radio communication system which employs the high frequency IC according to one embodiment of the present invention.

In FIG. 7, "Idle" indicates an idle mode in which the radio communication system does not transmit or receive as in a waiting time; "Warm up" indicates a warm-up mode in which the PLL is started and locked before transmission or reception; "Rx" indicates a reception mode in which circuits associated with reception are operated to receive a signal; and "Tx" indicates a transmission mode in which circuits associated with transmission are operated to transmit a signal. These modes are started in response to a command supplied from the baseband circuit 300 to the control circuit 260 of the high frequency IC 200. The command may be comprised of a code of a predetermined bit length such as eight bits (hereinafter called the "Word"), and a plurality of command codes have been previously provided for the command.

After powering on, as the baseband circuit 300 supplies the high frequency IC 200 with a command "System Reset Word". The control circuit 260 resets circuits such as the registers within the high frequency IC 200, so that the high frequency IC 200 enters the idle mode (at timing t1 in FIG. 7). This idle mode is a low power consumption mode in which the respective VCOs are prohibited from oscillating.

Next, as the control circuit 260 is supplied with a command "VCO Calibration Word" comprised of a predetermined bit code, a measurement of the frequency is started for each band assigned to the RFVCO 250 and IFVCO 230 (at timing t2). In the high frequency IC 200 of this embodiment, the RFVCO 250 is assigned 16 bands while the IFVCO 230 is assigned eight bands, so that the measurement of the frequencies of the IFVCO 230 finishes earlier than that of the RFVCO 250 (at timing t3). Therefore, a measurement of the frequency of the transmission TXVCO 240a is automatically started using the counters 32N, 32A which have been used for measuring the frequency of the IFVCO 230. Upon terminating the measurement of the frequency of the TXVCO 240a, a measurement of the frequency is started for the TXVCO 240b (at timing t4). A band to be used is selected for the IFVCO 230 immediately after the frequencies have been measured for the IFVCO 230.

After transmission of "VCO Calibration Word", the baseband circuit 300 sends "System Configuration Word" for instructing initial settings after a proper time has elapsed (at timing t5). Upon terminating the measurement of the frequency of the TXVCO 240b, the control circuit 260 is notified of the termination, so that the control circuit 260 makes the initial settings for the internal circuits of the high frequency IC 200 for a transmission/reception operation after the measurement.

After the initial settings, the baseband circuit 300 supplies the high frequency IC 200 with "Synthesiser Control Word" which includes a value that should be set in the counter 22 (information on the frequency of a channel to be used) (at timing t6). In response, the control circuit 260 enters the warm-up mode, selects a band to be used by the RFVCO 250 based on the frequency information from the baseband circuit 300 and the measured frequencies stored in the register 18, and sets a frequency value in the counter 22. Then, the control circuit 260 forces the RFVCO 250 to oscillate to bring the reception PLL loop into a locked state. The Synthesiser_Control word includes a single control bit [TR] which is used to tell the IC that the next active slot will be a 'Transmit' or a 'Receive' slot. If 'Transmit' is selected, then sending the Synthesiser word into the radio chip turns on the IFVCO and IF synthesiser. The IFVCO must be running and locked before the transmit slot. If 'Receive' mode is selected, sending the Synthesiser word into the IC does not turn on the IFVCO/IF synthesiser. Of course, it is possible for the baseband to send 'Transmit' mode and then send a Receive word. In this case, when the IC receives the Synthesiser_Control word, the IFVCO/IF synthesiser will become active and lock onto the correct frequency. Then, when the Receiver word is programmed into the IC, the IFVCO/IF synthesiser will turn off automatically.

Subsequently, the baseband circuit 300 sends "Receiver Control Word" to the high frequency IC 200 for instructing a reception operation (at timing t7). In response, the control circuit 260 also starts the offset cancel circuit 213 to cancel the input DC offsets of the amplifiers in the high gain amplification units 220A, 220B. After the DC offsets cancel, the control circuit 260 enters the reception mode, and operates the reception related circuit RXC to amplify and demodulate a reception signal. The control circuit 260 also switches the switch SW1 and the like depending on whether the reception signal conforms to GSM or DCS/PCS. The reception mode is executed in time units called a "time slot" (for example, every 577 μsec), as in the transmission mode.

Upon termination of the reception mode, the baseband circuit 300 sends "Synthesiser Control Word" which includes values that should be set in the counters 22, 32 (information on the frequencies of used channels) and instructs the warm-up mode (at timing t8). In response, the control circuit 260 enters the warm-up mode, selects a band to be used by the RFVCO 250 based on the frequency information from the baseband circuit 300 and the measured frequencies stored in the register 18, and sets frequency values in the counters 22, 32. Then, the control circuit 260 forces the RFVCO 250 and IFVCO 230 to oscillate to bring an RFPLL and an IFPLL loop into a locked state.

Subsequently, the baseband circuit 300 sends the high frequency IC 200 "Transmitter Control Word" which instructs a transmission operation (at timing t9). In response, the control circuit 260 enters the transmission mode, selects a band to be used by the TXVCO 240 based on the frequency information from the processing circuit 38 and the measured frequencies stored in the register 37, operates the TXVCO 240a or 240b and the transmission related circuit TXC, and brings the transmission PLL loop into a locked state in which a transmission signal is modulated and amplified. The control circuit 260 also turns on the transmission switch SW4, and switches the switch SW2 and the like depending on whether the transmission signal conforms to GSM or DCS/PCS. Whether to use the TXVCO 240a or 240b is determined by a predetermined code included in the command supplied from the baseband circuit 300.

Figure 8:
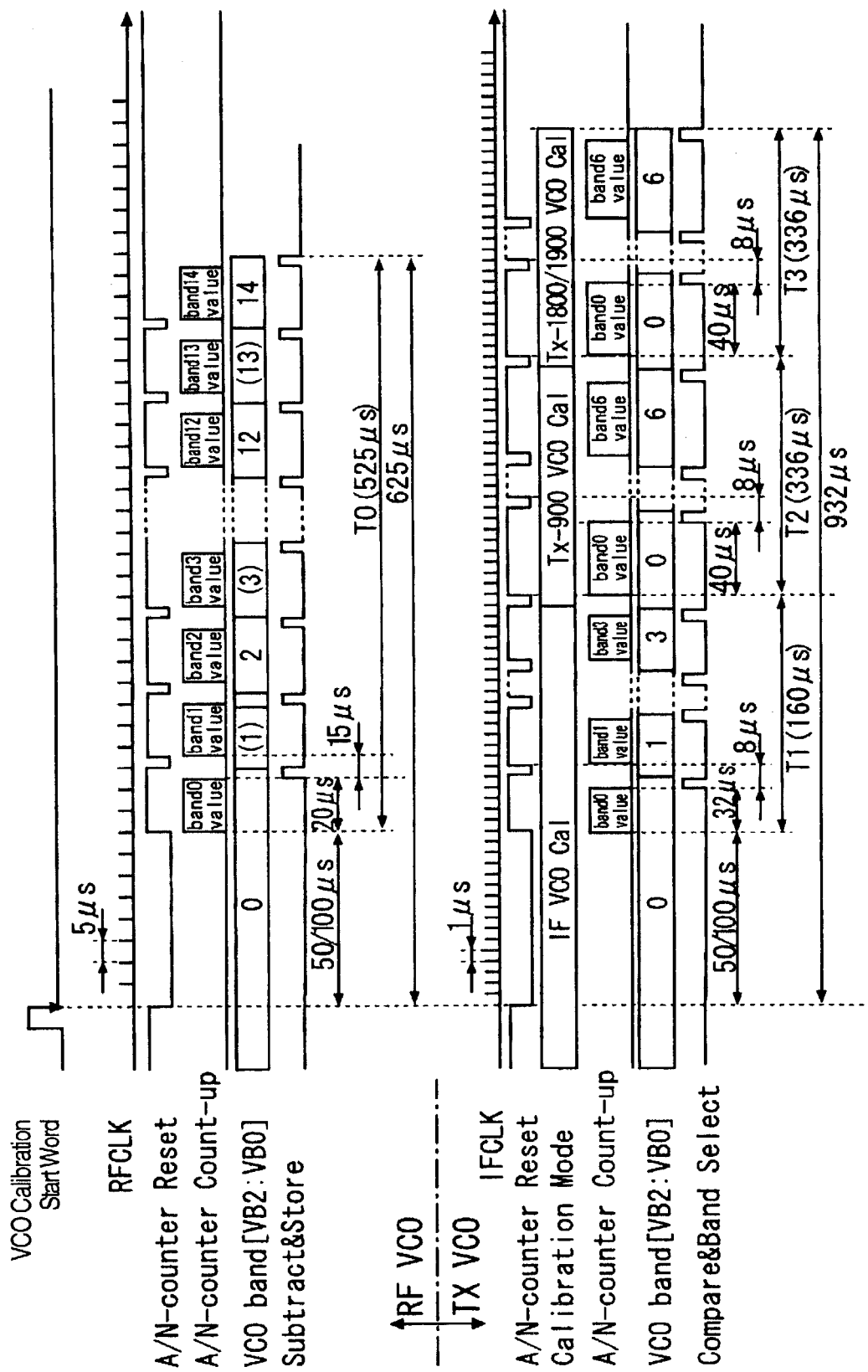
FIG. 8 is a timing chart showing in greater details the timing at which the frequency of each VCO is measured.

FIG. 8 shows in greater details the timings at which the frequency is measured for each of bands assigned to the RFVCO 250, IFVCO 230, TXVCO 240a, 240b in the idle mode. In FIG. 8, T0 indicates a period in which the frequency is measured for the RFVCO 250; T1 indicates a period in which the frequency is measured for the IFVCO 230; T2 indicates a period in which the frequency is measured for the TXVCO 240a; and T3 indicates a period in which the frequency is measured for the TXVCO 240b.

As shown in FIG. 8, in the high frequency IC of this embodiment, the frequency is measured for each of the lower 15 bands (0–14) of 16 bands assigned to the RFVCO 250, while the frequency is measured for each of the lower seven bands (0–6) of eight bands assigned to the TXVCOs 240a, 240b. This is because, even without measured values for the highest frequency bands, when a band corresponding to a frequency specified by the baseband circuit does not fall within any of the bands, the frequencies of which have been measured, the band decision circuit may select the highest band, the frequency of which is not measured, or is obliged to select the highest band.

As can be seen from FIG. 8, in the high frequency IC of this embodiment, the frequency of the RFVCO 250 is measured in synchronism with a clock RFCLK, the period of which is 5 µs, while the frequencies of the IFVCO 230 and TXVCO 240a, 240b is measured in synchronism with a clock IFCLK, the period of which is 1 µs. This is because the measurement is matched with the operating rate of the counters 22, 32 which operate in the transmission/reception mode.

Figure 9:
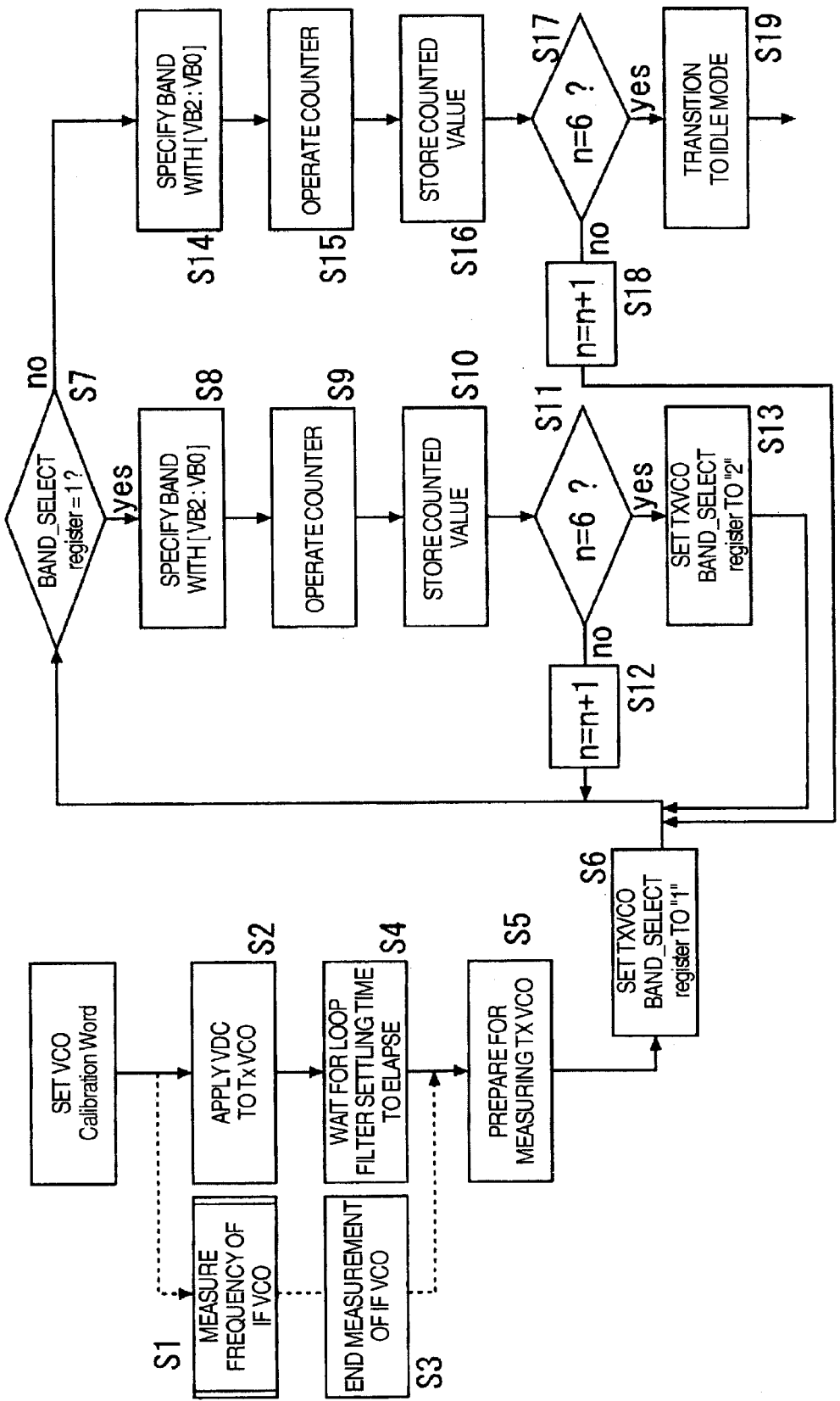
FIG. 9 is a flow chart illustrating an exemplary procedure for measuring the frequency of the TXVCO.

Referring next to a flow chart of FIG. 9, description will be made on a procedure for measuring the frequencies of the IFVCO 230, TXVCO 240a, 240b using the counter 32 under the control of the control circuit 260.

As VCO Calibration Word is set as a command, the frequency is measured for the IFVCO 230 (step S1), and in parallel with the measurement, the loop filter 238 of the transmission TXPLL is applied with and held in the DC voltage VDC for measuring the frequency (step S2). As a settling time has elapsed after the frequency was measured for the IFVCO 230 so that the voltage applied to the loop filter 238 settles to the DC voltage VDC (steps S3, S4), the control circuit 260 makes preparation for measuring the frequency of the TXVCO, such as setting a value in the prescaler 31 (the initial value is "16"), setting the N counter 32N to operate as an 11-bit counter for the measurement, and the like (step S5).

Next, the control circuit 260 specifies, using a TXVCO BAND_SELECT register whether the frequency is measured for the TXVCO 240a or 240b (step S6). In this embodiment, the control circuit 260 first specifies the TXVCO 240a for GSM by setting one to BAND_SELECT register. Then, the control circuit 260 specifies a band under measurement using band the selection code VB2–VB0 (step S8). Subsequently, the control circuit 260 operates the N counter 32N to count, for example, for 40 µs (step S9). Then, the counted value is stored in the register 37 (step S10). The control circuit 260 determines whether or not the frequency has been measured for the last band, and if not, the control circuit 260 updates the band selection code VB2–VB0 to change the band under measurement and returns to step S7 (steps S11, S12).

On the other hand, if the control circuit 260 determines at step S11 that the frequency has been measured for the last band, the flow proceeds to step S13, where the control circuit 260 changes the BAND_SELECT register for specifying the TXVCO under measurement to "2" and returns to step S7.

Subsequently, the control circuit 260 executes steps S14–S18 similar to steps S8–S12 to measure the frequency of the TXVCO 240b, and then returns to the idle mode (step S19).

While the invention made by the inventors has been described in specific manner with reference to the embodiment, the present invention is not limited to the foregoing embodiment. For example, in the foregoing embodiment, the frequencies of the TXVCOs 240a, 240b are measured using the counter 32 provided for the IFVCO 230. Alternatively, the measurement may be made using the counter 22 provided for the RFVCO 250. Further alternatively, the frequency of the TXVCO 240a may be measured using the counter 32 provided for the IFVCO 230, while the frequency of the TXVCO 240b may be measured using the counter 22 provided for the RFVCO 250. In addition, instead of measuring the frequencies of the TXVCOs 240a, 240b for all frequency bands, the frequencies may be measured only for odd-numbered bands or for even-numbered bands, and frequencies of bands, not measured, may be calculated by averaging measured frequency values of the respective preceding and subsequent bands.

Further, in the foregoing embodiment, the frequencies of the TXVCOs 240a, 240b are measured using the counter 32 provided for the IFVCO 230 in a viewpoint of limiting an increase in the circuit scale. Alternatively, an additional counter 32 may be separately provided for measuring the frequencies of the TXVCOs 240a, 240b, such that the frequencies of the TXVCOs 240a, 240b may be measured in parallel with measurements of the frequencies of the RFVCO 250 or IFVCO 230 in response to a single command. Advantageously, the addition of the counter 32 permits the frequencies of a plurality of VCOs to be measured in a short time at the expense of a slight increase in the circuit scale.

Also, in the foregoing embodiment, the IFVCO 230 is configured to be operable in any of four bands, however, the IFVCO may be configured to be operable in a single band and may not be capable of measuring the frequency. In this case, the frequencies of the TXVCOs 240a, 240b may be measured using the counter 22 provided for measuring the frequency of the RFVCO 250.

Also, the foregoing embodiment has been described for an example in which inductors are connected external to the IC, inductors fabricated on the IC may be used as the inductors L1, L2.

In the foregoing description, the present invention made by the inventors has been discussed in connection with a high frequency IC for use in a radio communication system such as a portable telephone which is capable of communicating in accordance with four communication schemes: GSM850, GSM900, DCS1800, PCS1900 which are the field of utilization that underlies the invention. The present invention, however, is not limited to this particular high frequency IC, but may be applied to a transmission VCO mounted in a high frequency IC for use in a portable telephone which can support a communication scheme called EDGE that has a QPSK modulation mode which is something like a combination of amplitude modulation with phase modulation in GSM. The high frequency IC has a transmission related circuit which employs a so-called polar loop configuration that has a phase loop and an amplitude loop for a modulation method.

This system is not limited to GSM operation, GPRS operation or EDGE operation or WCDMA operation. This band-selection system for oscillators in a radio IC can be used in any communications system where the IC has multiple switched band oscillators.

In conclusion, the foregoing embodiment provides the following advantages.

The transmission semiconductor integrated circuit described in the embodiment is capable of oscillating over a wide frequency range, completing a selection of a band to be used by a transmission VCO in a short time, and reducing the burden on a baseband circuit for determining a band to be used by the transmission VCO, when an oscillator circuit forming part of a transmission PLL circuit is fabricated on a single semiconductor chip together with other oscillator circuits such as an oscillator circuit which forms part of a reception PLL circuit and an oscillator circuit for an intermediate frequency.

Also, the communication semiconductor integrated circuit in the foregoing embodiment can communicate using signals in a plurality of frequency bands, and comprises oscillator circuits RFVCO, IFVCO, TXVCO which can be fabricated on the same semiconductor chip together with a modulator circuit, a demodulator circuit, and the like to thereby reduce the number of parts which make up the system and achieve a reduction in size of the system.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A communication semiconductor integrated circuit, comprising:
   a first, a second, and a third oscillator circuit each capable of oscillating in a plurality of frequency bands;
   one or two or more frequency counters for measuring oscillating frequencies of said first, second, and third oscillator circuits;
   storage means for storing results of measurements on the oscillating frequencies made by said frequency counter in each of the frequency bands of said first, second, and third oscillator circuits; and
   a control circuit for applying a predetermined DC control voltage to said first, second, and third oscillator circuits to oscillate at respective oscillating frequencies, and for controlling said frequency counter to measure the oscillating frequencies and store the measured frequencies in said storage means, said control circuit configured to determine operating frequency bands for said first and second oscillator circuits based on set frequency information for said first and second oscillator circuits, and the results of measurements stored in said storage means, and to determine an operating frequency band for said third oscillator circuit based on the set frequency information for said first and second oscillator circuits, and the results of measurements stored in said storage means.

2. A communication semiconductor integrated circuit according to claim 1, wherein:
   said third oscillator circuit is configured to oscillate at a frequency corresponding to a difference in frequency between oscillating signals respectively outputted from said first and second oscillator circuits or between signals divided from said oscillating signals; and
   said control circuit is configured to calculate a value corresponding to a target oscillating frequency for said third oscillator circuit from the set frequency information for said first oscillator circuit and the set information for said second oscillator circuit, and to determine the operating frequency band for said third oscillator circuit based on said calculated value and the result of measurement on said third oscillator circuit stored in said storage means.

3. A communication semiconductor integrated circuit according to claim 2, further comprising:
   a modulator circuit for modulating an oscillating signal of said second oscillator circuit or a signal divided from said oscillating signal in accordance with a baseband signal;
   a mixer for mixing an oscillating signal from said first oscillator circuit or a signal divided from said oscillating signal with a signal in accordance with an oscillating output of said third oscillator circuit to generate a frequency at a frequency corresponding to a difference in frequency between said two signals; and
   a PLL loop for controlling said mixer such that the frequency of an output signal from said mixer matches the frequency of an output signal from said modulator circuit.

4. A communication semiconductor integrated circuit according to claim 1, further comprising:
   a first frequency counter for measuring the oscillating frequency of said first oscillator circuit; and
   a second frequency counter for measuring the oscillating frequency of said second oscillator circuit,
   wherein either said first frequency counter or said second frequency counter is configured to measure the oscillating frequency of said third oscillator circuit in each frequency band.

5. A communication semiconductor integrated circuit according to claim 4, wherein said third oscillator circuit includes a first oscillator to be used for a first frequency band and a second oscillator to be used for a second frequency band which is different from the first frequency band, and wherein said first oscillator circuit is assigned a number of frequency bands larger than the number of frequency bands assigned to said second circuit and one of said first and second oscillators included in said third oscillator circuit, and said second frequency counter is configured to measure the oscillating frequency of said third oscillator circuit.

6. A communication semiconductor integrated circuit according to claim 1, further comprising a counter disposed before each said oscillator circuit for dividing an oscillating signal from the oscillator circuit associated therewith, wherein said counter functions as said frequency counter.

7. A communication semiconductor integrated circuit according to claim 1, further comprising a demodulator circuit for generating a demodulated signal based on the oscillating signal outputted from said first oscillator circuit or a signal divided from said oscillating signal, and a received signal.

8. A communication semiconductor integrated circuit according to claim 1, wherein said third oscillator circuit includes a first oscillator for generating a transmission signal conforming to a GSM scheme, and a second oscillator for generating a transmission signal conforming to a DCS scheme, and said third oscillator circuit is configured to selectively operate one of said first and second oscillators corresponding to a frequency band determined by said control circuit.

9. A radio communication system comprising:
   a communication semiconductor integrated circuit according to claim 8;
   a baseband circuit for extracting data from a received signal downconverted to a desired frequency by said communication semiconductor integrated circuit, and converting transmission data to I, Q signals; and said control circuit configured to receive from said baseband circuit said set frequency information and an instruction for selecting either said first oscillator or said second oscillator.

10. A radio communication system according to claim 9, capable of transmitting and receiving in accordance with three or more communication schemes including at least a GSM scheme, a DCS scheme, and a PCS scheme, wherein said first oscillator is configured to generate a transmission signal conforming to the GSM scheme, and said second oscillator is configured to generate transmission signals conforming to the DCS scheme and PCS scheme.

* * * * *

UNITED STATES PATENT AND TRADEMARK OFFICE
CERTIFICATE OF CORRECTION

PATENT NO. : 7,020,444 B2  Page 1 of 1
APPLICATION NO. : 10/372922
DATED : March 28, 2006
INVENTOR(S) : J. Shinbo et al.

It is certified that error appears in the above-identified patent and that said Letters Patent is hereby corrected as shown below:

ON THE TITLE PAGE

Please correct (30) Foreign Application Priority Data to read as follows:

(30)   Foreign Application Priority Data

Sep. 13, 2002            (GB) . . . . . . . . . . . . . 0221303.1

Signed and Sealed this

Eighteenth Day of March, 2008

JON W. DUDAS
*Director of the United States Patent and Trademark Office*

UNITED STATES PATENT AND TRADEMARK OFFICE
CERTIFICATE OF CORRECTION

PATENT NO. : 7,020,444 B2  
APPLICATION NO. : 10/372922  
DATED : March 28, 2006  
INVENTOR(S) : J. Shinbo et al.

Page 1 of 1

It is certified that error appears in the above-identified patent and that said Letters Patent is hereby corrected as shown below:

ON THE TITLE PAGE

Please correct (73) Assignee to read as follows:

(73) Assignee:     Renesas Technology Corp., Tokyo (JP)

<u>TTPCOM Ltd.</u>
<u>Melbourn, Royston, Hertfordshire (UK)</u>

Signed and Sealed this

Fourth Day of November, 2008

JON W. DUDAS
*Director of the United States Patent and Trademark Office*